(12) United States Patent
Park et al.

(10) Patent No.: US 9,871,194 B2
(45) Date of Patent: Jan. 16, 2018

(54) ION BEAM APPARATUS GENERATING ION BEAMS OF BILATERAL SYMMETRY

(71) Applicants: Jongchul Park, Seongnam-si (KR); Hyungjoon Kwon, Seongnam-si (KR)

(72) Inventors: Jongchul Park, Seongnam-si (KR); Hyungjoon Kwon, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/449,897

(22) Filed: Mar. 3, 2017

(65) Prior Publication Data

US 2017/0179381 A1 Jun. 22, 2017

Related U.S. Application Data

(62) Division of application No. 14/919,723, filed on Oct. 21, 2015, now Pat. No. 9,627,610.

(30) Foreign Application Priority Data

Nov. 25, 2014 (KR) .................... 10-2014-0165349

(51) Int. Cl.
*H01L 43/12* (2006.01)
*H01J 37/32* (2006.01)

(52) U.S. Cl.
CPC ........ *H01L 43/12* (2013.01); *H01J 37/32357* (2013.01); *H01J 37/32422* (2013.01); *H01J 37/32623* (2013.01); *H01J 2237/083* (2013.01); *H01J 2237/3174* (2013.01); *H01J 2237/334* (2013.01)

(58) Field of Classification Search
CPC .............. H01L 43/12; H01L 31/1876; H01L 21/31138; H01L 21/02071; H01L 21/31116; H01L 21/67069; H01J 37/32357; H01J 37/32623; H01J 37/32422; H01J 2237/334; H01J 2237/083; H01J 2237/3174
See application file for complete search history.

(56) References Cited

U.S. PATENT DOCUMENTS 5,376,225 A 12/1994 Wakabayashi et al.
6,238,582 B1 5/2001 Williams et al.
(Continued)

FOREIGN PATENT DOCUMENTS

JP 4063136 B2 3/2008
JP 5253457 B2 7/2013
(Continued)

*Primary Examiner* — Caridad Everhart
(74) *Attorney, Agent, or Firm* — Renaissance IP Law Group LLP

(57) ABSTRACT

A pattern-forming method includes providing a first ion beam at a first incidence angle and a second ion beam at a second incidence angle to a surface of an etch target layer formed on a substrate. Patterns are formed by patterning the etch target layer using the first and second ion beams. The first ion beam and the second ion beam are substantially symmetrical to each other with respect to a normal line that is perpendicular to a top surface of the substrate. Each of the first and second incidence angles is greater than 0 degrees and smaller than an angle obtained by subtracting a predetermined angle from 90 degrees.

19 Claims, 19 Drawing Sheets

(56) References Cited

U.S. PATENT DOCUMENTS

| | | |
|---|---|---|
| 6,780,341 B2 | 8/2004 | Garcia et al. |
| 8,858,816 B2 | 10/2014 | Godet et al. |
| 2004/0026375 A1 | 2/2004 | Garcia et al. |
| 2006/0152164 A1 | 7/2006 | Lee et al. |
| 2012/0080609 A1* | 4/2012 | Kameyama ............ H01J 37/09 |
| | | 250/396 R |
| 2012/0104274 A1* | 5/2012 | Hirayanagi ............ B82Y 10/00 |
| | | 250/424 |
| 2014/0017817 A1 | 1/2014 | Godet et al. |
| 2014/0034611 A1 | 2/2014 | Godet et al. |
| 2015/0179409 A1 | 6/2015 | Biloiu et al. |

FOREIGN PATENT DOCUMENTS

| | | |
|---|---|---|
| KR | 1020050059789 A | 6/2005 |
| KR | 100729352 B1 | 6/2007 |
| KR | 100866902 B1 | 11/2008 |
| KR | 1020130053191 A | 5/2013 |
| KR | 101419375 B1 | 7/2014 |

* cited by examiner

ION BEAM APPARATUS GENERATING ION BEAMS OF BILATERAL SYMMETRY

CROSS-REFERENCE TO RELATED APPLICATIONS

This U.S. non-provisional patent application is a divisional application of U.S. patent application Ser. No. 14/919,723, filed Oct. 21, 2015, which claims priority under 35 U.S.C. §119 to Korean Patent Application No. 10-2014-0165349, filed on Nov. 25, 2014, in the Korean Intellectual Property Office, the disclosure of which is hereby incorporated by reference in its entirety.

BACKGROUND OF THE INVENTION

Example embodiments of the inventive concepts relate to a method of forming a pattern using ion beams of bilateral symmetry, a method of forming a magnetic memory device using the same, and an ion beam apparatus generating ion beams of bilateral symmetry.

Magnetic memory devices are being developed as semiconductor memory devices satisfying the industry demands for higher speed and lower power consumption memory devices. Magnetic memory devices are next-generation semiconductor memory devices because of their high-speed performance and non-volatile characteristics.

Generally, magnetic memory devices may include a magnetic tunnel junction (MTJ) pattern. The MTJ pattern may include two magnetic layers and an insulating layer disposed between the two magnetic layers. A resistance value of the MTJ pattern may be changed according to magnetization directions of the two magnetic layers. For example, the MTJ pattern may have a relatively high resistance value if the magnetization directions of the two magnetic layers are anti-parallel to each other. The MTJ pattern may have a relatively low resistance value if the magnetization directions of the two magnetic layers are parallel to each other. Data values may be represented in the MTJ pattern using a difference between the resistance values.

The electronic industry is increasingly demanding more highly integrated and lower power consuming magnetic memory devices. Accordingly, research is being conducted into various ways for satisfying these demands.

SUMMARY

Example embodiments of the inventive concepts provide a method of forming a pattern capable of easily controlling a sidewall profile of the pattern.

Example embodiments of the inventive concepts also provide a method of forming a magnetic memory device with excellent reliability.

Example embodiments of the inventive concepts also provide an ion beam apparatus capable of stably providing ion beams of bilateral symmetry and of controlling an incidence angle of each of the ion beams.

In one aspect, a method of forming a pattern may include providing a first ion beam radiated to a surface of an etch target layer formed on a substrate at a first incidence angle and a second ion beam radiated to the surface of the etch target layer at a second incidence angle. Patterns may be formed by patterning the etch target layer using the first and second ion beams. The first ion beam and the second ion beam may be symmetrical to each other with respect to a normal line that is substantially perpendicular to a top surface of the substrate. Each of the first and second incidence angles may be greater than 0 degrees with respect to the normal line and smaller than an angle obtained by subtracting a first angle from 90 degrees. The first angle may be defined by the following equation 1:

$$\alpha = \arctan(B/A). \qquad \text{[Equation 1]}$$

Where "$\alpha$" denotes the first angle, "A" denotes a distance between adjacent patterns, and "B" denotes a height of the patterns.

In an embodiment, the first ion beam and the second ion beam may be radiated to one region of the surface of the etch target layer at the same time. The irradiated region may be a region of a range corresponding to the distance between the patterns.

In an embodiment, each of the patterns may have a first sidewall and a second sidewall arranged opposite to each other. The first sidewall of one pattern in a pair of patterns located adjacent to each other may face the second sidewall of the other of the patterns in the pair of patterns. The etch target layer may be etched by the first ion beam to form the first sidewall, and the etch target layer may be etched by the second ion beam to form the second sidewall.

In an embodiment, the first incidence angle may be substantially equal to the second incidence angle.

In an embodiment, forming the patterns may include: etching the etch target layer using the first and second ion beams to form a trench in the etch target layer. Each of the first and second incidence angles (measured with respect to the normal line) may be greater than a second angle at which an etch rate at a bottom surface of the trench is twice an etch rate at a sidewall of the trench during etching of the etch target layer, and may be smaller than the angle obtained by subtracting the first angle from 90 degrees.

In an embodiment, the etch target layer may include at least one magnetic layer.

In another aspect, a method of forming a magnetic memory device may include: providing a first ion beam radiated at a first incidence angle and a second ion beam radiated at a second incidence angle to a surface of a magnetic tunnel junction layer formed on a substrate; and forming magnetic tunnel junction patterns by patterning the magnetic tunnel junction layer using the first ion beam and the second ion beam. The first ion beam and the second ion beam may be applied substantially symmetrically with respect to a normal line that is perpendicular to a top surface of the substrate. Each of the first and second incidence angles may be greater than 0 degrees measured from the normal line and smaller than an angle obtained by subtracting a first angle from 90 degrees. The magnitude of the first angle may be defined by Equation 1.

In an embodiment, the first ion beam and the second ion beam may be radiated to one region of the surface of the magnetic tunnel junction layer at substantially the same time. The one region may be a region of a range corresponding to the distance between the magnetic tunnel junction patterns.

In an embodiment, each of the magnetic tunnel junction patterns may have a first sidewall and a second sidewall arranged opposite to each other. The first sidewall of one pattern in a pair of magnetic tunnel junction patterns located adjacent to each other may face the second sidewall of the other pattern in the pair of magnetic tunnel junction patterns. The magnetic tunnel junction layer may be etched by the first ion beam to form the first sidewall, and the magnetic tunnel junction layer may be etched by the second ion beam to form the second sidewall.

In an embodiment, a magnitude of the first incidence angle may be substantially equal to that of the second incidence angle.

In an embodiment, forming the magnetic tunnel junction patterns may include: etching the magnetic tunnel junction layer using the first and second ion beams to form a trench in the magnetic tunnel junction layer. Each of the first and second incidence angles may be greater than a second angle measured from the normal line at which an etch rate at a bottom surface of the trench is twice an etch rate at a sidewall of the trench during etching of the magnetic tunnel junction layer, and may be smaller than the angle obtained by subtracting the first angle from 90 degrees.

In an embodiment, the magnetic tunnel junction layer may include: a first magnetic layer, a tunnel barrier layer, and a second magnetic layer sequentially stacked on the substrate. Forming the magnetic tunnel junction patterns may include: sequentially etching the second magnetic layer, the tunnel barrier layer and the first magnetic layer using the first ion beam and the second ion beam.

In an embodiment, each of the first and second magnetic layers may have a magnetization direction that is substantially perpendicular to an interface between the second magnetic layer and the tunnel barrier layer.

In an embodiment, each of the first and second magnetic layers may have a magnetization direction that is substantially parallel to an interface between the second magnetic layer and the tunnel barrier layer.

In still another aspect, a method of forming a magnetic memory device may include: generating an ion beam radiated to a surface of a magnetic tunnel junction layer formed on a substrate; providing a first grid and a second grid horizontally spaced apart from each other on optical paths of the ion beam; dividing the ion beam into a first ion beam and a second ion beam, the first ion beam guided by the first grid so as to be radiated to the surface of the magnetic tunnel junction layer at a first incidence angle, and the second ion beam guided by the second grid so as to be radiated to the surface of the magnetic tunnel junction layer at a second incidence angle; and forming magnetic tunnel junction patterns by patterning the magnetic tunnel junction layer using the first and second ion beams. The first ion beam and the second ion beam may be substantially symmetrical to each other with respect to a normal line that is perpendicular to a top surface of the substrate.

In an embodiment, the first ion beam and the second ion beam may be radiated to one region of the surface of the magnetic tunnel junction layer at the same time. The one region may be a region of a range corresponding to a distance between the magnetic tunnel junction patterns.

In an embodiment, each of the magnetic tunnel junction patterns may have a first sidewall and a second sidewall arranged opposite to each other. The first sidewall of one of a pair of adjacent magnetic tunnel junction patterns may face the second sidewall of the other pattern in the pair of magnetic tunnel junction patterns. The magnetic tunnel junction layer may be etched by the first ion beam to form the first sidewall, and the magnetic tunnel junction layer may be etched by the second ion beam to form the second sidewall.

In an embodiment, the first incidence angle may be substantially equal to the second incidence angle.

In an embodiment, each of the first and second incidence angles may be greater than 0 degrees with respect to the normal line and smaller than an angle obtained by subtracting a first angle from 90 degrees. The first angle may be defined by Equation 1.

In an embodiment, forming the magnetic tunnel junction patterns may include: etching the magnetic tunnel junction layer using the first and second ion beams to form a trench in the magnetic tunnel junction layer. Each of the first and second incidence angles may be greater than a second angle measured from the normal line at which an etch rate at a bottom surface of the trench is twice an etch rate at a sidewall of the trench during etching of the magnetic tunnel junction layer, and may be smaller than the angle obtained by subtracting the first angle from 90 degrees.

(or a tilting angle) of the first and second grids with respect to the top surface of the substrate to adjust the first and second incidence angles.

In an embodiment, the first incidence angle and the second incidence angles may be adjusted to be substantially equal to each other.

In an embodiment, the magnetic tunnel junction layer may include: a first magnetic layer, a tunnel barrier layer, and a second magnetic layer sequentially stacked on the substrate. Forming the magnetic tunnel junction patterns may include: sequentially etching the second magnetic layer, the tunnel barrier layer, and the first magnetic layer using the first ion beam and the second ion beam.

In an embodiment, each of the first and second magnetic layers may have a magnetization direction that is substantially perpendicular to an interface between the second magnetic layer and the tunnel barrier layer.

In an embodiment, each of the first and second magnetic layers may have a magnetization direction that is substantially parallel to an interface between the second magnetic layer and the tunnel barrier layer.

In yet another aspect, a method of forming a magnetic memory device may include: forming a magnetic tunnel junction layer on a substrate; generating plasma over a surface of the magnetic tunnel junction layer, where a sheath region is defined between the plasma and the surface of the magnetic tunnel junction layer, and where the number of electrons in the sheath region is less than that of the plasma; providing insulators between the plasma and the surface of the magnetic tunnel junction layer to change a shape of a boundary between the plasma and the one region; providing a first ion beam radiated to the surface of the magnetic tunnel junction layer at a first incidence angle and a second ion beam radiated to the surface of the magnetic tunnel junction at a second incidence angle, the first ion beam and the second ion beam intersecting the boundary from the plasma so as to be radiated to the surface of the magnetic tunnel junction layer through gap regions between the insulators; and forming magnetic tunnel junction patterns by patterning the magnetic tunnel junction layer using the first ion beam and the second ion beam. The first ion beam and the second ion beam may be radiated substantially symmetrically to each other with respect to a normal line that is perpendicular to a top surface of the substrate. Each of the first and second incidence angles may be greater than 0 degrees with respect to the normal line and smaller than an angle obtained by subtracting a first angle from 90 degrees. The first angle may be defined by Equation 1.

In an embodiment, the first ion beam and the second ion beam may be radiated to a predetermined region of the surface of the magnetic tunnel junction layer at substantially the same time, and the predetermined region of the surface of the magnetic tunnel junction layer may be a region of a range corresponding to the distance between the magnetic tunnel junction patterns.

In an embodiment, the first incidence angle may be substantially equal to the second incidence angle.

In an embodiment, the insulators may include: a first insulator and a second insulator horizontally spaced apart from each other and disposed at substantially the same vertical level from the substrate; and a third insulator provided between the first insulator and the second insulator in a plan view and disposed at a higher vertical level than the first and second insulators from the substrate. The insulators may change a form of an electric field generated in a region to control a shape of the boundary between the plasma and the region. The first ion beam may intersect the boundary between the first insulator and the third insulator so as to be radiated to the surface of the magnetic tunnel junction layer through a gap region between the first insulator and the third insulator. The second ion beam may intersect the boundary between the second insulator and the third insulator so as to be radiated to the surface of the magnetic tunnel junction layer through a gap region between the second insulator and the third insulator.

In an embodiment, forming the magnetic tunnel junction patterns may include: etching the magnetic tunnel junction layer using the first and second ion beams to form a trench in the magnetic tunnel junction layer. Each of the first and second incidence angles may be greater than a second angle measured from a normal line at which an etch rate at a bottom surface of the trench is twice an etch rate at a sidewall of the trench during etching of the magnetic tunnel junction layer, and may be smaller than the angle obtained by subtracting the first angle from 90 degrees.

In yet still another aspect, an ion beam apparatus may include: a stage on which a substrate is loaded; an ion source part provided over the stage and generating an ion beam; and an ion beam control part provided between the stage and the ion source part, the ion beam control part controlling an optical path of an ion beam radiated to a surface of the substrate. The ion beam control part may include: a first grid and a second grid horizontally spaced apart from each other. The ion beam may be divided into a first ion beam and a second ion beam. The first ion beam may be guided by the first grid so as to be radiated to the surface of the substrate at a first incidence angle measured from a normal line that is perpendicular to the surface of the substrate, and the second ion beam may be guided by the second grid so as to be radiated to the surface of the substrate at a second incidence angle measured from the normal line. The first ion beam and the second ion beam may be substantially symmetrical with respect to the normal line.

In an embodiment, the first ion beam and the second ion beam may be guided to be radiated to one region of the surface of the substrate, and the one region of the surface of the substrate may be a region of a range corresponding to a distance between patterns which are formed using the first and second ion beams on the substrate.

In an embodiment, the first ion beam and the second ion beam may be radiated to the one region of the surface of the substrate at substantially the same time.

In an embodiment, the magnitude of the first incidence angle may be substantially equal to that of the second incidence angle.

In an embodiment, each of the first grid and the second grid may include: a first sub-grid and a second sub-grid sequentially stacked, and each of the first and second sub-grids may include a plurality of holes. Each of the holes of the first sub-grid may be substantially aligned with a corresponding one of the holes of the second sub-grid.

In an embodiment, each of the first and second grids may guide a corresponding one of the first and second ion beams using an electric field that is generated by supplying the first sub-grid and the second sub-grid with different voltages from each other.

In an embodiment, an electric field may not be generated in a space between the substrate and the ion beam control part.

In an embodiment, the ion beam apparatus may further include a third sub-grid disposed between the first sub-grid and the second sub-grid and having a plurality of holes. Each of the holes of the third sub-grid may be substantially aligned with a corresponding one of the holes of the first sub-grid and a corresponding one of the holes of the second sub-grid.

In an embodiment, each of the first and second grids may guide each of the first and second ion beams using an electric field that is generated by supplying the first, second, and third sub-grids with different voltages from each other.

In an embodiment, the ion beam control part may further include a connection part provided between the first grid and the second grid. Each of the connection part, the first grid, and the second grid may have a substantially bar-like shape extending in a first direction when viewed in plan view. Corresponding ends of the connection part may be respectively connected to one end of the first grid and one end of the second grid.

In an embodiment, the ion beam control part may further include: a support part supporting the first grid and the second grid. Another end of the first grid and another end of the second grid may be connected to the support part.

In an embodiment, the connection part may be disposed at a level higher than the support part from a top surface of the stage, and each of the first grid and the second grid may be capable of being tilted with respect to the top surface of the stage.

In an embodiment, the first grid and the second grid may be disposed substantially symmetrical to each other with the connection part interposed therebetween.

In an embodiment, the support part may be disposed at a level lower than the first and second grids from the top surface of the stage.

In an embodiment, the first incidence angle and the second incidence angle may be adjusted by changing slopes of the first and second grids with respect to the top surface of the stage.

In an embodiment, the slopes of the first and second grids with respect to the top surface of the stage may be adjusted by changing a first vertical distance between the connection part and the support part.

In an embodiment, when the first vertical distance between the connection part and the support part is changed, the first and second ion beams may be guided by the first and second grids to be radiated to one region of the surface of the substrate by changing a second vertical distance between the top surface of the stage and the support part. The one region may be a region of a range corresponding to a distance between patterns which are formed using the first and second ion beams on the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
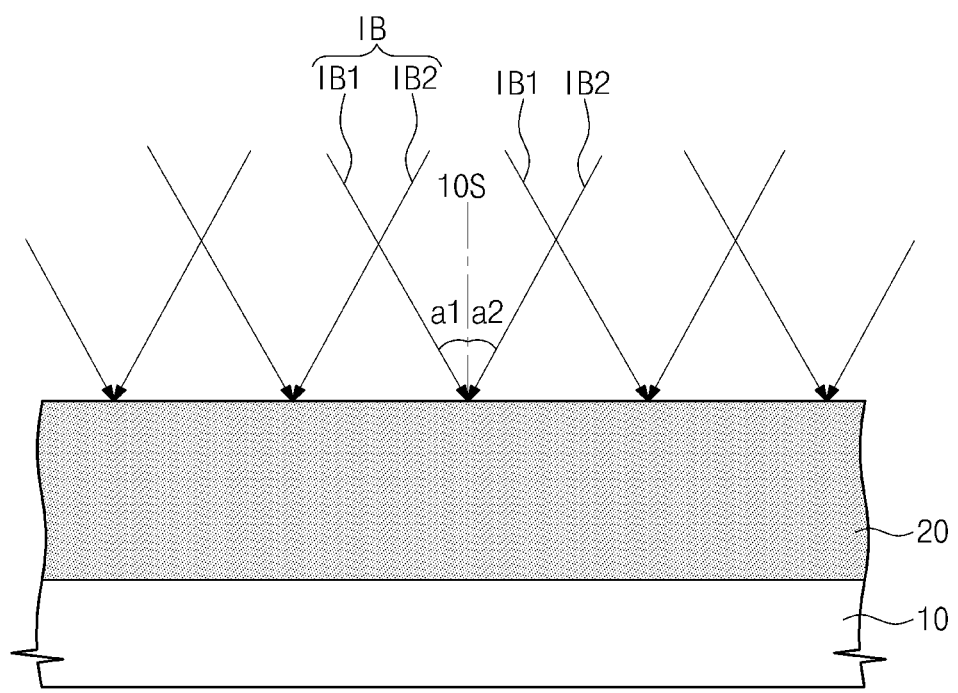
FIGS. 1 and 2 are schematic cross-sectional views of an etch target layer illustrating a method of forming a pattern according to example embodiments of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art. In the drawings, the thicknesses of layers and regions may be exaggerated for clarity. Like reference numerals in the drawings denote like elements, and thus redundant description thereof may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

As used herein, the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Moreover, exemplary embodiments are described herein with reference to cross-sectional illustrations and/or planar illustrations that are idealized exemplary illustrations. Accordingly, variations from the shapes of the features or elements depicted in the illustrations that result, for example, from manufacturing techniques and/or tolerances, are to be expected. Thus, exemplary embodiments should not be construed as being limited to the shapes of regions illustrated herein, but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive concepts.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
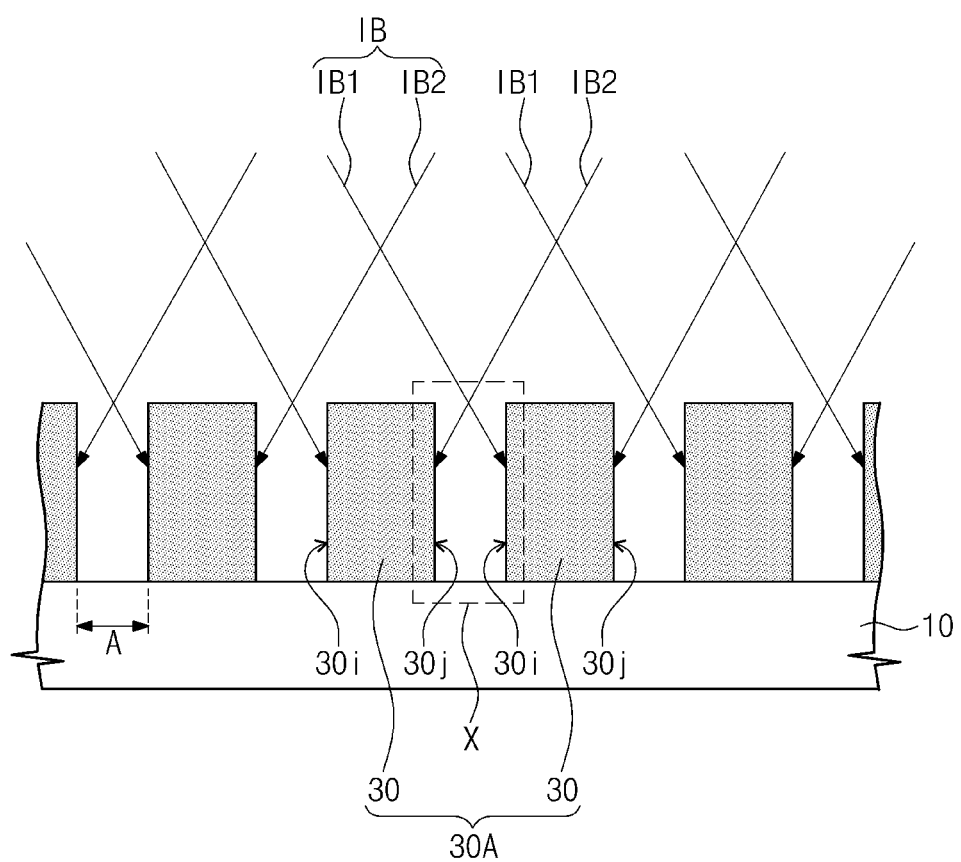
Figure 3:
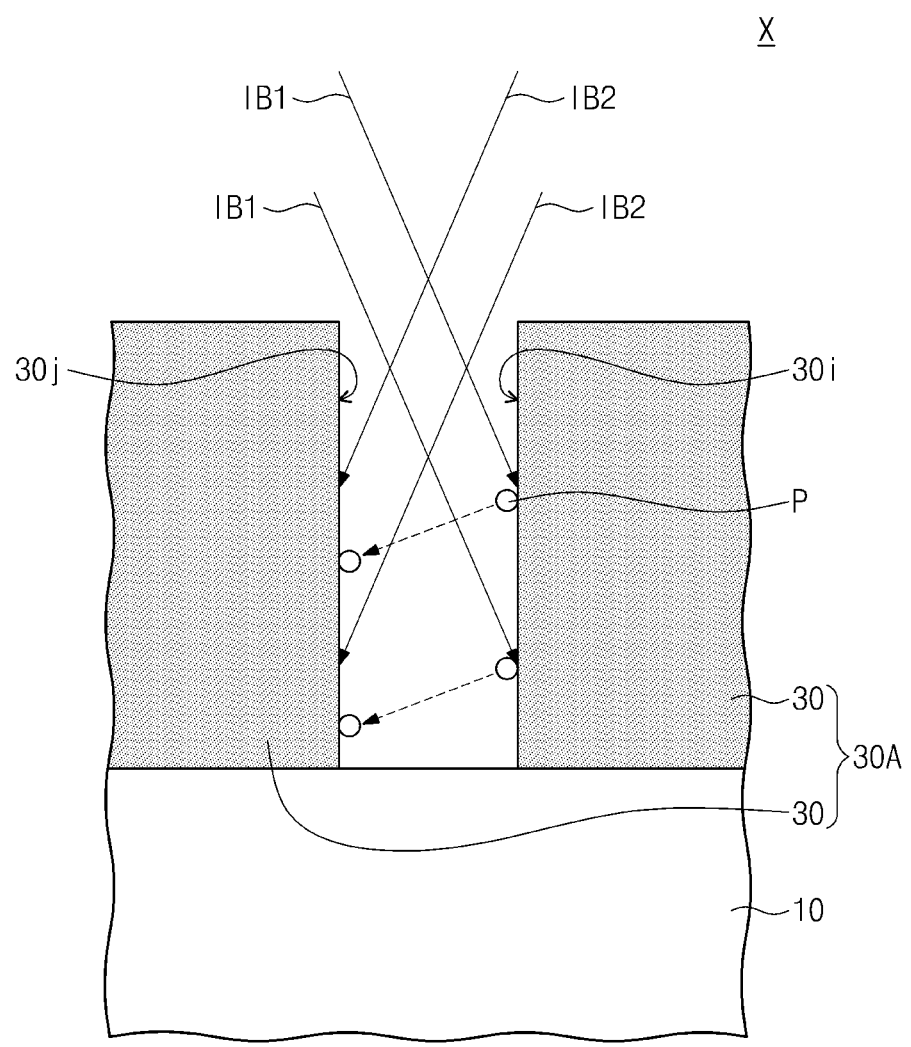
FIG. 3 is an enlarged view of a portion 'X' of FIG. 2.
Figure 4:
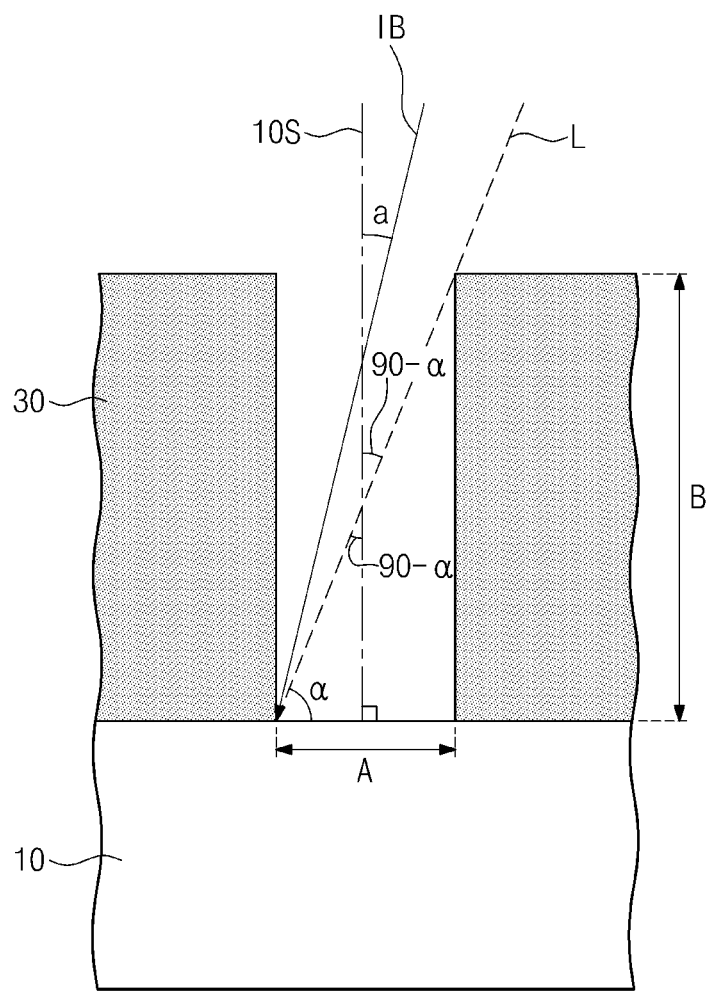
FIGS. 4 and 5 are schematic cross-sectional views of the etch target layer illustrating a range of an incidence angle of an ion beam according to example embodiments of the inventive concepts.
Figure 5:
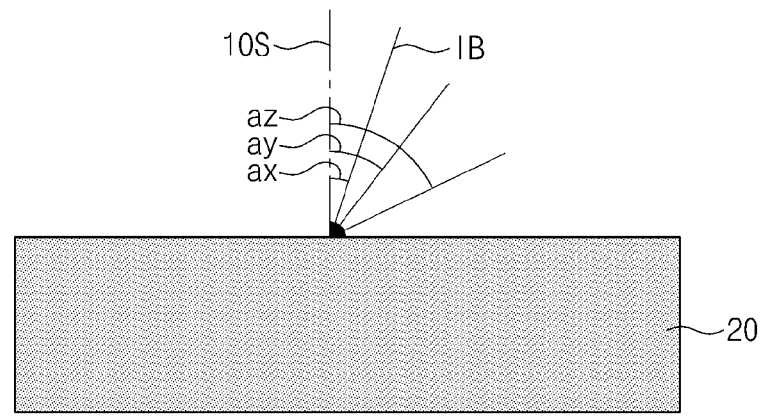
Figure 6:
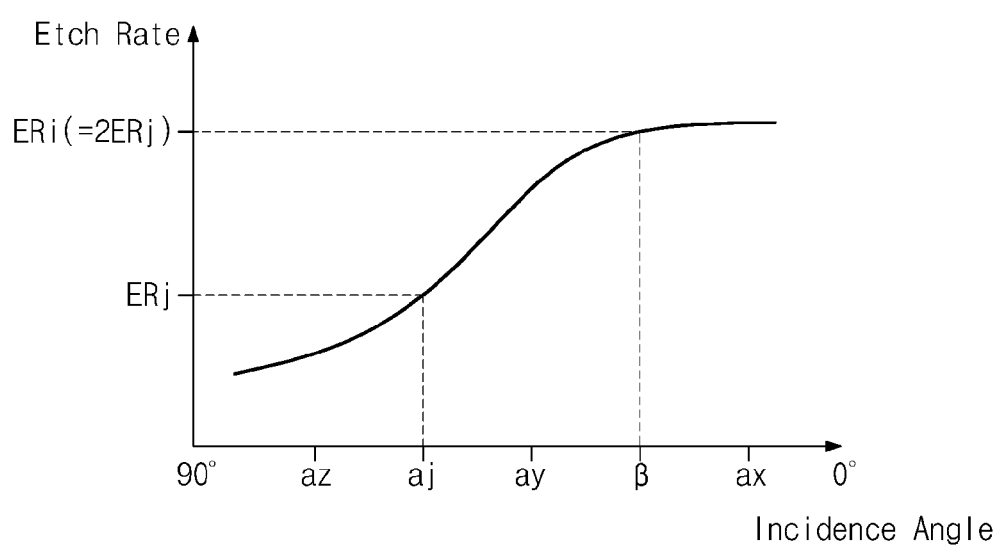
FIG. 6 is a graph illustrating the effect of the incidence angle on the etch rate of the etch target layer, according to further aspects of the present inventive concepts.
Figure 7:
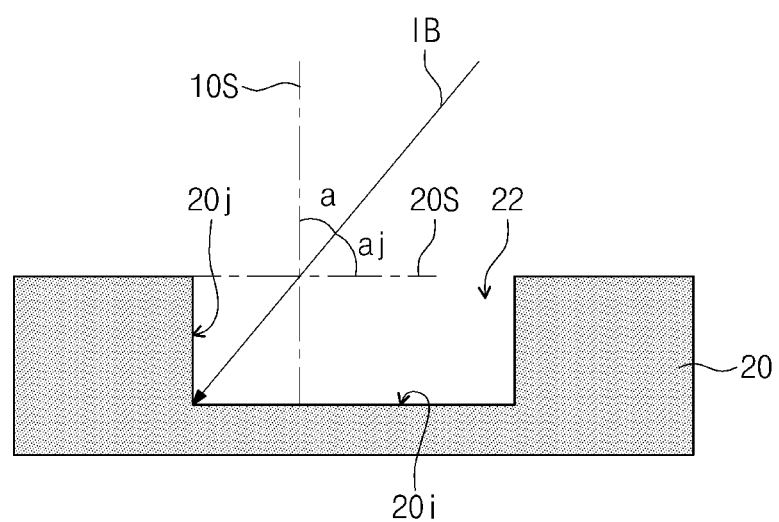
FIG. 7 is a schematic cross-sectional view of the etch target layer further illustrating a method of forming a pattern according to example embodiments of the inventive concepts.

FIGS. 1 and 2 are schematic cross-sectional views of an etch target layer 20 arranged on a substrate 10, illustrating a method of forming a pattern according to example embodiments of the inventive concepts. FIG. 3 is an enlarged view of a portion 'X' of FIG. 2. FIGS. 4 and 5 are schematic cross-sectional views of the etch target layer 20 illustrating a range of an incidence angle of an ion beam according to example embodiments of the inventive concepts. FIG. 6 is a graph illustrating the effect of the incidence angle on the etch rate of the etch target layer, according to further aspects of the present inventive concepts. And FIG. 7 is a schematic cross-sectional view of the etch target layer 20 further illustrating a method of forming a pattern according to example embodiments of the inventive concepts.

Referring to FIG. 1, an etch target layer 20 may be provided on a substrate 10. The substrate 10 may include a semiconductor substrate. The etch target layer 20 may include, but is not limited to, at least one magnetic layer.

An ion beam IB may be radiated to a surface of the etch target layer 20. The ion beam IB may include a first ion beam IB1 having a first incidence angle a1 with respect to a normal line 10S arranged substantially perpendicular to a top surface of the substrate 10. The ion beam IB may further include a second ion beam IB2 having a second incidence angle a2 with respect to the normal line 10S. The first ion beam IB1 and the second ion beam IB2 may be substantially symmetrically applied with respect to the normal line 10S, and the first incidence angle a1 may therefore be substantially equal to the second incidence angle a2. In other words, a magnitude of the first incidence angle a1 may be substantially equal to a magnitude of the second incidence angle a2. The first ion beam IB1 and the second ion beam IB2 may be radiated to one region of the surface of the etch target layer 20 at the same time. As illustrated in FIG. 2, the one region may be a region of a range corresponding to a distance A between patterns 30 formed by patterning the etch target layer 20. Desirable ranges for the first and second incidence angles a1 and a2, respectively, will be described later with reference to FIGS. 4-7.

Referring now to FIG. 2, the etch target layer 20 may be patterned using the first ion beam IB1 and the second ion beam IB2 to form patterns 30. Each of the patterns 30 may have a first sidewall 30i and a second sidewall 30j that are arranged opposite to each other. Each first sidewall 30i of the patterns 30 may face a second sidewall 30j of an adjacent pattern 30. Likewise, each second sidewall 30j of the patterns 30 may face a first sidewall 30i of an adjacent pattern 30. In other words, a first sidewall 30i of one pattern 30 of a pair of adjacent patterns 30A may face a second sidewall 30j of the other pattern 30 of the pair of adjacent patterns 30A.

The etch target layer 20 may be etched by the first ion beam IB1 to form the first sidewall 30i of each of the patterns 30. The etch target layer 20 may be etched by the second ion beam IB2 to form the second sidewall 30j of each of the patterns 30. In other words, the first sidewall 30i of a pattern 30 and the second sidewall 30j of the other pattern 30 in the adjacent pattern pair 30A may be respectively formed using the first ion beam IB1 and the second ion beam IB2.

Referring to FIG. 3, etch-byproducts P may result from etching the etch target layer 20 using the first ion beam IB1 to form the first sidewall 30i in a pair of adjacent patterns 30A. Those etch-byproducts P may then be re-deposited on the second sidewall 30j of the other pattern 30 in the pair of patterns 30A. The re-deposited etch-byproducts P may make it difficult to control a sidewall profile of each of the patterns 30.

According to embodiments of the inventive concepts, however, the etch target layer 20 may be substantially simultaneously etched by the second ion beam IB2 to form the second sidewall 30j of the other pattern 30 in the pair of patterns 30A. By providing the first ion beam IB1 and the second ion beam IB2 at substantially the same time during the process of patterning the etch target layer 20, etch-byproducts P that may be re-deposited on the second sidewall 30j of the adjacent pattern 30 may be removed by the second ion beam IB2. Thus, using the principles of the inventive concepts, it is possible to easily control the sidewall profiles of each of the patterns 30.

The desirable ranges for the incidence angles of the ion beams IB radiated to the surface of the etch target layer 20 will now be described with reference to FIGS. 4 to 7. In the following description, the ion beam IB may mean either the first ion beam IB1 or the second ion beam IB2. And the range of the magnitude of the incidence angle of the first ion beam IB1 may be substantially equal to the range of the magnitude of the incidence angle of the second ion beam IB2.

Referring first to FIG. 4, a reference line L is tilted at a first angle α with respect to the top surface of the substrate 10. The magnitude of the first angle α may be defined using a relationship between the distance A between the patterns 30 and a height B of the patterns 30. More specifically, the magnitude of the first angle α may be defined by the following Equation 1:

$$\alpha = \arctan(B/A) \quad \text{[Equation 1]}$$

The ion beam IB may have an incidence angle a measured with respect to a normal line 10S that is arranged substantially perpendicular to the top surface of the substrate 10. In some embodiments, the incidence angle a may be greater than 0 degrees and smaller than an angle obtained by subtracting the magnitude of the first angle α from 90 degrees. The magnitude of a may therefore be defined by the following Equation 2:

$$0° < a < (90° - \alpha) \quad \text{[Equation 2]}$$

Referring to FIGS. 5 and 6, an etch rate of the etch target layer 20 may vary depending on the incidence angle a of the ion beam IB with respect to the normal line 10S. If the ion beam IB has a predetermined incident energy, the etch rate of the etch target layer 20 may vary as illustrated in FIG. 6 as the incidence angle a increases (i.e., ax<ay<az). If the incident energy of the ion beam IB is varied, however, the relationship between the etch rate of the etch target layer 20 and the incidence angle a may have interrelation different from that illustrated in FIG. 6. For convenience in explanation, the relationship between the etch rate and the incidence angle a will now be described with reference to a graph of FIG. 6.

Referring to FIGS. 6 and 7, the etch target layer 20 may be patterned by the ion beam IB to form a trench 22 in the etch target layer 20. An incidence angle of the ion beam IB with respect to a bottom surface 20i of the trench 22 may be different from that of the ion beam IB with respect to a sidewall 20j of the trench 22. In other words, the ion beam IB may be radiated to the bottom surface 20i of the trench 22 at the incidence angle a, measured with respect to the normal line 10S, and may be radiated to the sidewall 20j at an sidewall incidence angle aj, measured with respect to a normal line 20S, that is perpendicular to the sidewall 20j. As described with reference to FIGS. 5 and 6, since the ion beam IB is radiated to the bottom surface 20i and the sidewall 20j at different incidence angles, the etch rate of the etch target layer 20 at the bottom surface 20i may be different from the etch rate of the etch target layer 20 at the sidewall 20j. In other words, the etch target layer 20 may have a bottom etch rate ERi at the bottom surface 20i and may have a sidewall etch rate ERj at the sidewall 20j, and the bottom etch rate ERi may be different from the sidewall etch rate ERj.

According to an embodiment, when the ion beam IB is radiated to the sidewall 20j at the sidewall incidence angle aj, the etch target layer 20 may have the sidewall etch rate ERj at the sidewall 20j, as illustrated in FIG. 6. A second angle β may be determined, where the second angle β represents the incidence angle at which the bottom etch rate ERi of the etch target layer 20 is twice the sidewall etch rate ERj (i.e., ERi=2×ERj). The incidence angle a of the ion beam IB may be greater than the second angle β. In other words, the incidence angle a of the ion beam IB may be greater than the second angle β and smaller than the angle obtained by subtracting the first angle α from 90 degrees, as represented by the following Equation 3:

$$\beta < a < (90° - \alpha) \quad \text{[Equation 3]}$$

Referring again to FIGS. 1 and 2, the first ion beam IB1 and the second ion beam IB2, which are bilaterally symmetrical about the normal line 10S, may be radiated to the one region of the surface of the etch target layer 20 at the same time. The first incidence angle a1 of the first ion beam IB1 may be substantially equal to the second incidence angle a2 of the second ion beam IB2. Each of the first and second incidence angles a1 and a2, respectively, may be greater than 0 degrees and smaller than the angle obtained by subtracting the magnitude of the first angle α from 90 degrees (i.e., $0° < a1 < (90° - \alpha)$, $0° < a2 < (90° - \alpha)$). And desirably, each of the first and second incidence angles a1 and a2, respectively, may be greater than the second angle β and smaller than the angle obtained by subtracting the magnitude of the first angle α from 90 degrees (i.e., $\beta < a1 < (90° - \alpha)$, $\beta < a2 < (90° - \alpha)$). Thus, the first sidewall 30i of one pattern 30 in a pair of adjacent patterns 30A and the second sidewall 30j of the other pattern in the pair of adjacent patterns 30A may be formed using the first ion beam IB1 and the second ion beam IB2, respectively.

Figure 8:
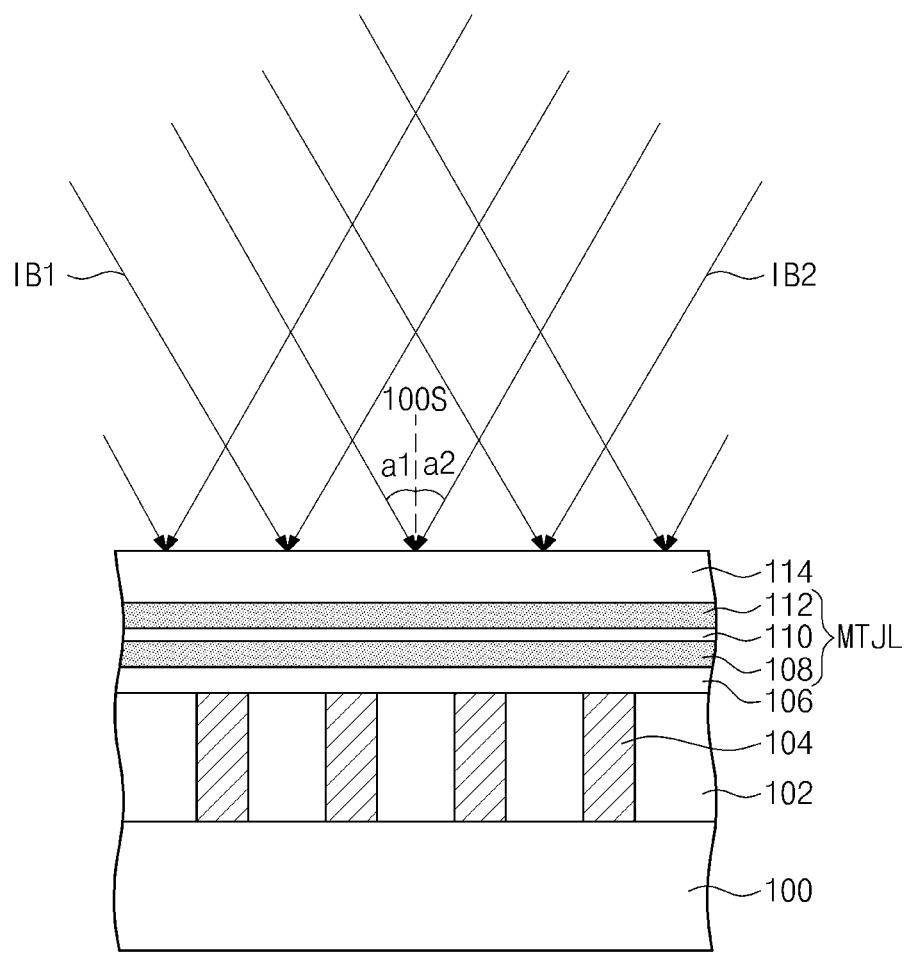
FIGS. 8, 9, and 11 are cross-sectional views illustrating a method of forming a magnetic memory device using the method of forming the pattern according to example embodiments of the inventive concepts.
Figure 9:
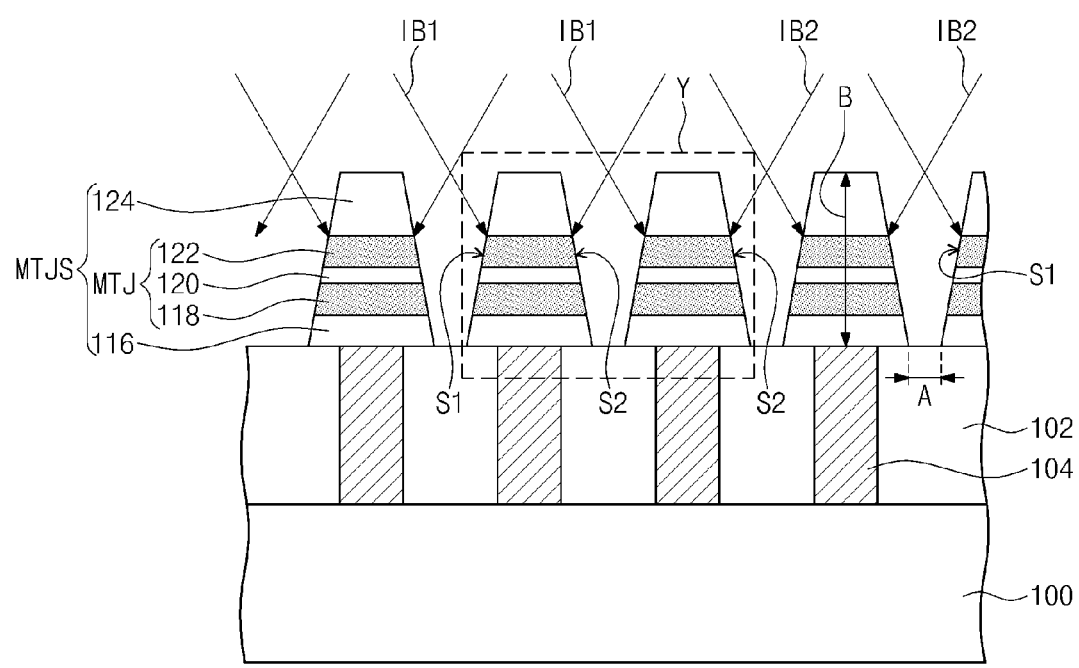
Figure 10:
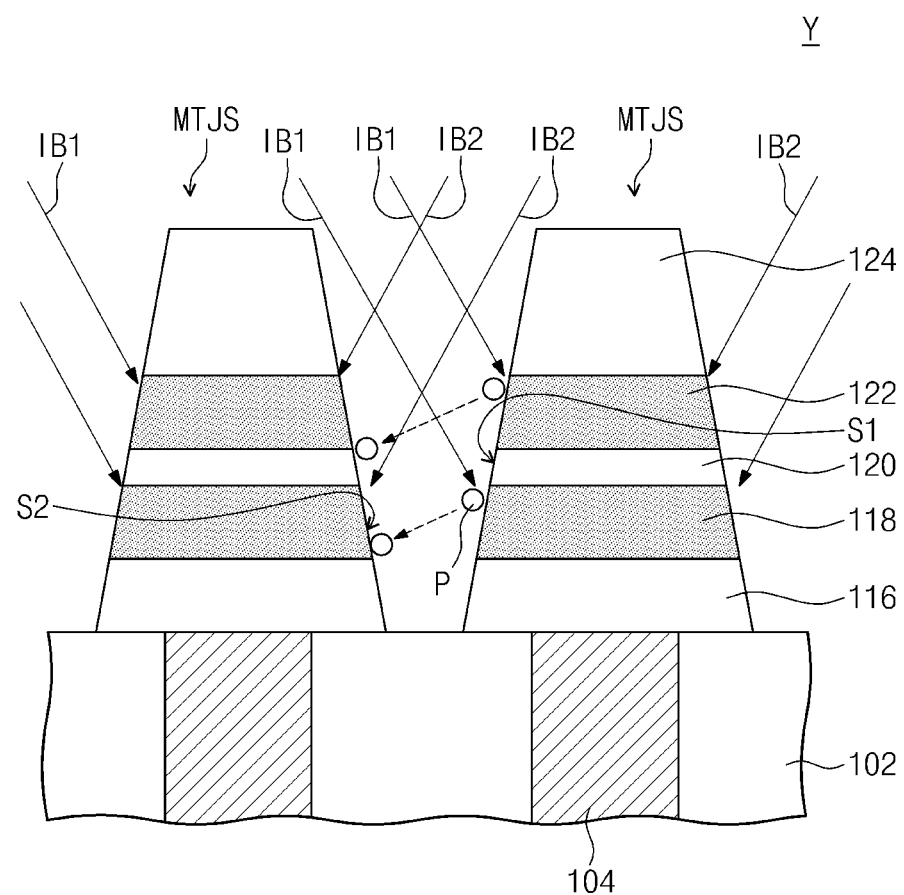
FIG. 10 is an enlarged view of a portion 'Y' of FIG. 9.
Figure 11:
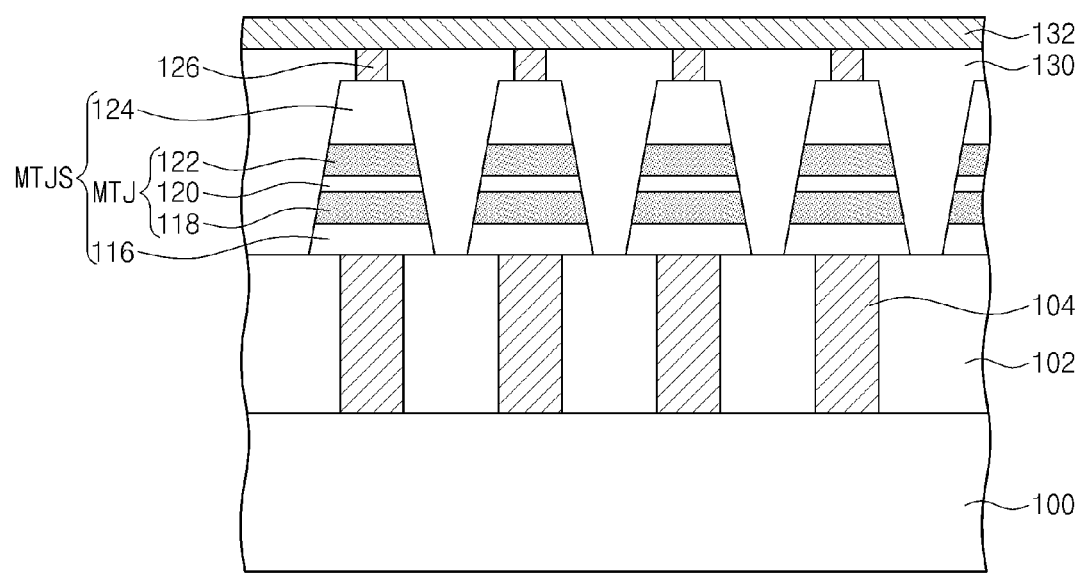
Figure 12A:
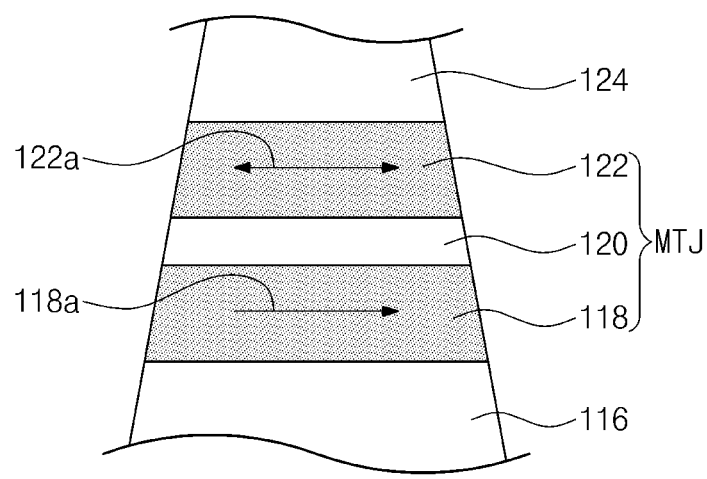
FIG. 12A is a cross-sectional view of a magnetic memory element illustrating an embodiment of a magnetic tunnel junction pattern.
Figure 12B:
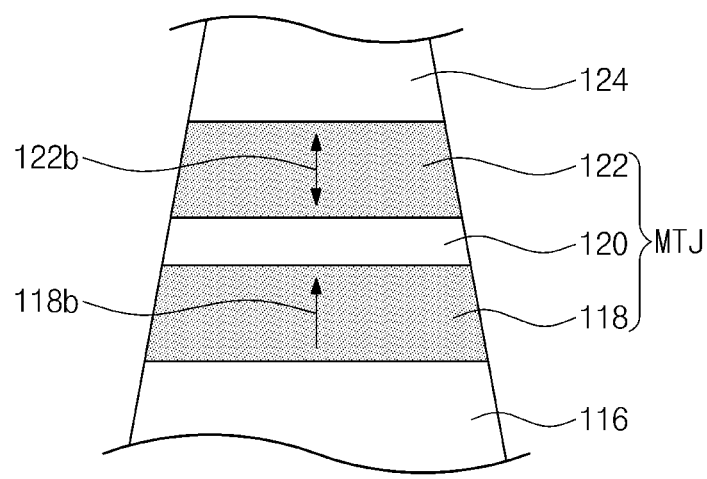
FIG. 12B is a cross-sectional view of a magnetic memory element illustrating another embodiment of a magnetic tunnel junction pattern.

FIGS. 8, 9, and 11 are cross-sectional views illustrating a method of forming a magnetic memory device using the method of forming the pattern according to example embodiments of the inventive concepts. FIG. 10 is an enlarged view of a portion 'Y' of FIG. 9. FIG. 12A is a cross-sectional view of a magnetic memory element illustrating an embodiment of a magnetic tunnel junction pattern, and FIG. 12B is a cross-sectional view of a magnetic memory element illustrating another embodiment of a magnetic tunnel junction pattern.

Referring now to FIG. 8, a lower interlayer insulating layer 102 may be formed on a substrate 100. The substrate 100 may include a semiconductor substrate. For example, the substrate 100 may include a silicon substrate, a germanium substrate, or a silicon-germanium substrate. In some embodiments, switching components (not shown) may be formed on the substrate 100, and the lower interlayer insulating layer 102 may cover the switching components. The switching components may, for example, be field effect transistors. Alternatively, the switching components may be diodes or other switching devices. The lower interlayer insulating layer 102 may be formed of a single-layer or multi-layer that includes at least one of an oxide, a nitride, or an oxynitride.

Lower contact plugs 104 may be formed in the lower interlayer insulating layer 102. Each of the lower contact plugs 104 may penetrate the lower interlayer insulating layer 102 so as to be electrically connected to one terminal of a corresponding one of the switching components. The lower contact plugs 104 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), or a metal-semiconductor compound (e.g., a metal silicide).

A sequentially stacked first conductive layer 106, magnetic tunnel junction layer MTJL, and second conductive layer 114 may be formed on the lower interlayer insulating layer 102. The first conductive layer 106 may include a conductive metal nitride such as titanium nitride and/or tantalum nitride. The first conductive layer 106 may include a material (e.g., ruthenium (Ru)) capable of aiding crystal growth of magnetic layers constituting the magnetic tunnel junction layer MTJL. The first conductive layer 106 may be formed by a sputtering process, a chemical vapor deposition (CVD) process, or an atomic layer deposition (ALD) process.

The magnetic tunnel junction layer MTJL may include a first magnetic layer 108, a tunnel barrier layer 110, and a second magnetic layer 112 which are sequentially stacked on the first conductive layer 106. One of the first and second magnetic layers 108 and 112, respectively, may correspond to a reference layer that has a magnetization direction fixed in one direction, and the other of the first and second magnetic layers 108 and 112, respectively, may correspond to a free layer that has a magnetization direction changeable to be parallel or anti-parallel to the fixed magnetization direction of the reference layer.

In some embodiments, the magnetization directions of the reference layer and the free layer may be substantially perpendicular to an interface between the tunnel barrier layer 110 and the second magnetic layer 112. In this case, each of the reference layer and the free layer may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) crystal structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked in bilayers. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. Here, the reference layer may be thicker than the free layer, and/or a coercive force of the reference layer may be greater than that of the free layer.

In other embodiments, the magnetization directions of the reference layer and the free layer may be substantially parallel to the interface between the tunnel barrier layer 110 and the second magnetic layer 112. In this case, each of the reference layer and the free layer may include a ferromagnetic material. The reference layer may further include an anti-ferromagnetic material that is used to fix a magnetization direction of the ferromagnetic material included in the reference layer.

The tunnel barrier layer 110 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

Each of the first magnetic layer 108, the tunnel barrier layer 110 and the second magnetic layer 112 may be formed by a physical vapor deposition (PVD) process or a CVD process.

The second conductive layer 114 may include at least one of tungsten, titanium, tantalum, aluminum, or metal nitrides (e.g., titanium nitride and tantalum nitride). The second conductive layer 114 may be formed using a PVD process or a CVD process.

Mask patterns (not shown) may be formed on the second conductive layer 114. The mask patterns may define regions in which magnetic tunnel junction structures to be described below will be formed. The mask patterns may be photoresist patterns or hard mask patterns. The hard mask patterns may include an oxide, a nitride, and/or an oxynitride.

An ion beam IB may be radiated to a surface of the second conductive layer 114. The ion beam IB may include a first ion beam IB1 having a first incidence angle a1 measured with respect to a normal line 100S that is substantially perpendicular to a top surface of the substrate 100. The ion beam IB may further include a second ion beam IB2 having a second incidence angle a2 measured with respect to the normal line 100S. The first ion beam IB1 and the second ion beam IB2 may be substantially symmetrically applied with respect to the normal line 100S, and the first incidence angle a1 may therefore be substantially equal to the second incidence angle a2. In other words, a magnitude of the first incidence angle a1 may be substantially equal to a magnitude of the second incidence angle a2. The first ion beam IB1 and the second ion beam IB2 may be radiated to one region of the surface of the second conductive layer 114 at the same time. As illustrated in FIG. 9, the one region may be a region of a range corresponding to a distance A between magnetic tunnel junction structures MTJS.

Referring now to FIG. 9, the second conductive layer 114, the magnetic tunnel junction layer MTJL, and the first conductive layer 106 may be sequentially etched using the first ion beam IB1 and the second ion beam IB2 to form a first conductive pattern 116, a magnetic tunnel junction pattern MTJ, and a second conductive pattern 124 from the stacked structure. Hereinafter, the first conductive pattern 116, the magnetic tunnel junction pattern MTJ, and the second conductive pattern 124 stacked on the lower interlayer insulating layer 102 may be defined as a magnetic tunnel junction structure MTJS. The etching process may use a plurality of the mask patterns as etch masks, so that a plurality of magnetic tunnel junction structure MTJS may be provided on the lower interlayer insulating layer 102. Each of the magnetic tunnel junction structures MTJS may be electrically connected to a corresponding one of the lower contact plugs 104 formed in the lower interlayer insulating layer 102. In an embodiment, a bottom surface of the first conductive pattern 116 of each of the magnetic tunnel junction structures MTJS may be in contact with a top surface of the corresponding lower contact plug 104.

The magnetic tunnel junction pattern MTJ of each of the magnetic tunnel junction structures MTJS may include a first magnetic pattern 118, a tunnel barrier pattern 120, and a second magnetic pattern 112 which are sequentially stacked on the first conductive pattern 116.

As illustrated in FIG. 12A, in some embodiments, magnetization directions 118a and 122a of the first and second magnetic patterns 118 and 122 may be substantially parallel to a contact surface of the tunnel barrier pattern 120 and the second magnetic pattern 122 (or a top surface of the first conductive pattern 116). Referring to FIG. 12A, the first magnetic pattern 118 may correspond to a reference pattern and the second magnetic pattern 122 may correspond to a free pattern. However, the inventive concepts are not limited thereto, and, unlike the embodiment shown in FIG. 12A, the first magnetic pattern 118 may, for example, correspond to the free pattern and the second magnetic pattern 122 may correspond to the reference pattern. The reference pattern may be thicker than the free pattern, and/or a coercive force of the reference pattern may be greater than that of the free pattern.

Each of the first and second magnetic patterns 118 and 122 having the parallel magnetization directions 118a and 122a may include a ferromagnetic material. The first magnetic pattern 118 may further include an anti-ferromagnetic material that is used to fix a magnetization direction of the ferromagnetic material included in the first magnetic pattern 118.

As illustrated in FIG. 12B, in other embodiments, magnetization directions 118b and 122b of the first and second magnetic patterns 118 and 122 may be substantially perpendicular to the contact surface of the tunnel barrier pattern 120 and the second magnetic pattern 122 (or the top surface of the first conductive pattern 116). Referring to FIG. 12B, the first magnetic pattern 118 may correspond to a reference pattern and the second magnetic pattern 122 may correspond to a free pattern. However, the inventive concepts are not limited thereto and, unlike the embodiment shown in FIG. 12B, the first magnetic pattern 118 may correspond to the free pattern and the second magnetic pattern 122 may correspond to the reference pattern.

Each of the first and second magnetic patterns 118 and 122 having the perpendicular magnetization directions 118b and 122b may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) crystal structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers that are alternately and repeatedly stacked in bilayers. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers.

Referring again to FIG. 9, each of the magnetic tunnel junction structures MTJS may include a first sidewall S1 and a second sidewall S2 arranged opposite to each other in a cross-sectional view. The first sidewall S1 of each of the magnetic tunnel junction structures MTJS may face the second sidewall S2 of an adjacent magnetic tunnel junction structure MTJS. Likewise, the second sidewall S2 of each of the magnetic tunnel junction structures MTJS may face the first sidewall S1 of an adjacent magnetic tunnel junction structure MTJS.

The second conductive layer 114, the magnetic tunnel junction layer MTJL, and the first conductive layer 106 may be etched by the first ion beam IB1 to form the first sidewalls S1 of the magnetic tunnel junction structures MTJS. The second conductive layer 114, the magnetic tunnel junction layer MTJL, and the first conductive layer 106 may be etched by the second ion beam IB2 to form the second sidewalls S2 of the magnetic tunnel junction structures MTJS. In other words, the first sidewall S1 of one magnetic tunnel junction structure MTJS in a pair of adjacent magnetic tunnel junction structures MTJS and the second sidewall S2 of the other magnetic tunnel junction structure MTJS in the pair of adjacent magnetic tunnel junction structures MTJS may be formed using the first ion beam IB1 and the second ion beam IB2, respectively.

Referring now to FIG. 10, etch-byproducts P may be generated from the second conductive layer 114, the magnetic tunnel junction layer MTJL, and the first conductive layer 106 during the etching process using the first ion beam IB1. These etch-byproducts P may be re-deposited on the second sidewall S2 of the other magnetic tunnel junction structure MTJS in the pair. The re-deposition of etch-byproducts may cause cell defects, such as an electrical short, for example, between the magnetic patterns 118 and 122 in a magnetic memory device including the magnetic tunnel junction pattern MTJ.

According to principles of the present inventive concepts, however, the second conductive layer 114, the magnetic tunnel junction layer MTJL, and the first conductive layer 106 may be substantially simultaneously etched by the second ion beam IB2 to form the second sidewall S2 of the other magnetic tunnel junction structure MTJS in the pair of adjacent magnetic tunnel junction structures MTJS. Thus, any etch-byproducts P re-deposited on the second sidewall S2 of the other magnetic tunnel junction structure MTJS may be removed by the second ion beam IB2 during the etching process. Likewise, any etch-byproducts P that may be re-deposited on the first sidewall S1 during the etching process using the second ion beam IB2, may be removed by the first ion beam IB1. As a result, it is possible to minimize the cell defects of the magnetic memory device which may otherwise be caused by the re-deposited etch-byproducts P.

Referring again to FIG. 9, desirable ranges of the first and second incidence angles a1 and a2, respectively, of the first and second ion beams IB1 and IB2, respectively, may be calculated using a distance A between the magnetic tunnel junction structures MTJS and a height B of the magnetic tunnel junction structures MTJS. For instance, a desirable range for each of the first and second incidence angles a1 and a2, respectively, may be determined as described previously with reference to FIGS. 4 to 7. In this case, the patterns 30 of FIG. 4 may correspond to the magnetic tunnel junction structures MTJS of FIG. 9, and the etch target layer 20 of FIGS. 5 and 7 may correspond to the stacked structure of FIGS. 8 and 9 including the first conductive layer 106, the magnetic tunnel junction layer MTJL, and the second conductive layer 114.

Referring back to FIG. 8, each of the first and second incidence angles a1 and a2, respectively, may be greater than 0 degrees, measured with respect to the normal line 100S, and smaller than an angle obtained by subtracting a magnitude of a first angle $\alpha$ from 90 degrees (i.e., $0°<a1<(90°-\alpha)$ and $0°<a2<(90°-\alpha)$). The magnitude of the first angle $\alpha$ may be defined by Equation 1 ($\alpha$=arctan (B/A)), where "A" denotes the distance between the magnetic tunnel junction structures MTJS, and "B" denotes the height of the magnetic tunnel junction structures MTJS.

During the etching process, the magnetic tunnel junction layer MTJL may be etched using the first and second ion beams IB1 and IB2, respectively, to form a trench (not shown) in the magnetic tunnel junction layer MTJL. A second angle $\beta$ may be defined with respect thereto, as represented by FIG. 6. The second angle $\beta$ may represent an angle at which an etch rate at a bottom surface of the trench is twice an etch rate at a sidewall of the trench during the etching process. Each of the first and second incidence angles a1 and a2, respectively, measured with respect to the normal line 100S, may be greater than the second angle $\beta$ and smaller than the angle obtained by subtracting the magnitude of the first angle $\alpha$ from 90 degrees (i.e., $\beta<a1<(90°-\alpha)$ and $\beta<a2<(90°-\alpha)$).

Referring to FIG. 11, after the magnetic tunnel junction structures MTJS have been formed through the etching process, an upper interlayer insulating layer 130 may be provided on the lower interlayer insulating layer 102 to cover the magnetic tunnel junction structures MTJS. The upper interlayer insulating layer 130 may be a single layer or a multi-layer. For example, the upper interlayer insulating layer 130 may include at least one of an oxide layer (e.g., a silicon oxide layer), a nitride layer (e.g., a silicon nitride layer), or an oxynitride layer (e.g., a silicon oxynitride layer). An interconnection 132 may be formed on the upper interlayer insulating layer 130. The interconnection 132 may extend substantially in one direction and may be electrically connected to a plurality of the magnetic tunnel junction structures MTJS arranged in the one direction. According to an embodiment, upper contact plugs 126 may be formed in the upper interlayer insulating layer 130 to electrically connect the magnetic tunnel junction structures MTJS to the interconnection 132. Each of the magnetic tunnel junction structures MTJS may be connected to the interconnection 132 through a corresponding one of the upper contact plugs 126. The interconnection 132 may function as a bit line.

Figure 13:
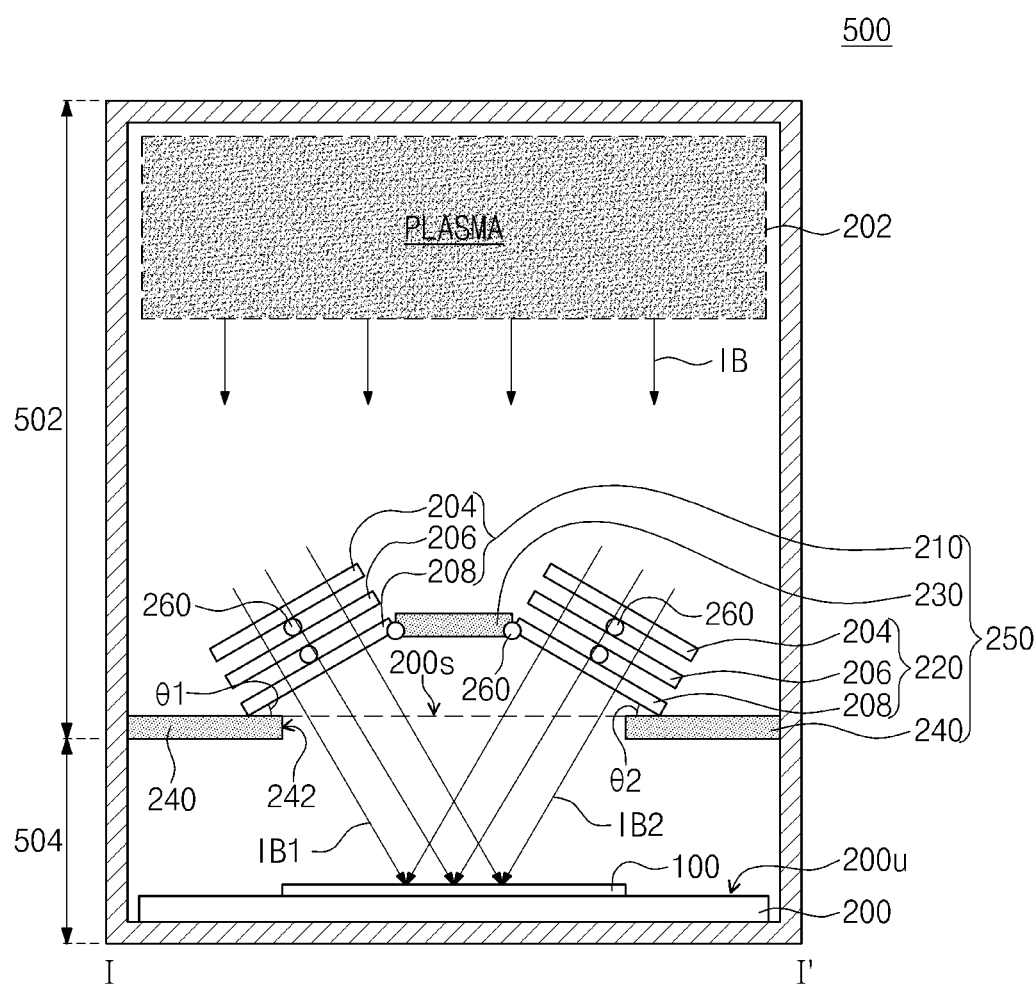
FIG. 13 is a schematic diagram illustrating an ion beam apparatus for generating ion beams of bilateral symmetry according to some embodiments of the inventive concepts.
Figure 14:
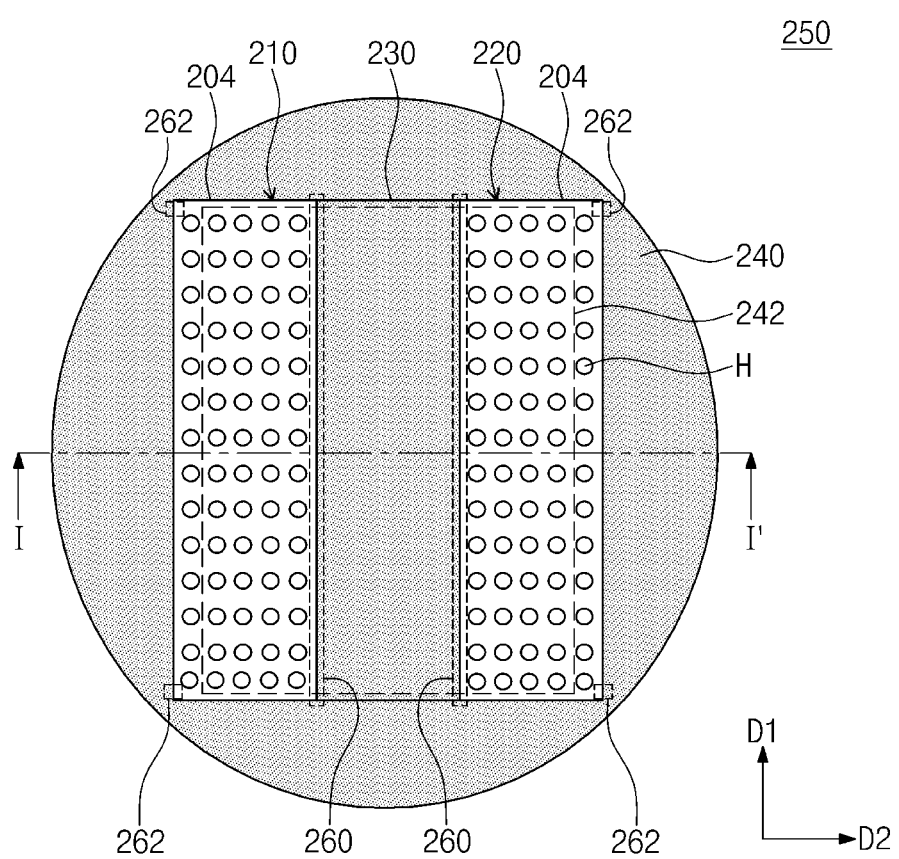
FIG. 14 is a plan view illustrating an ion beam control part of the ion beam apparatus of FIG. 13.
Figure 15:
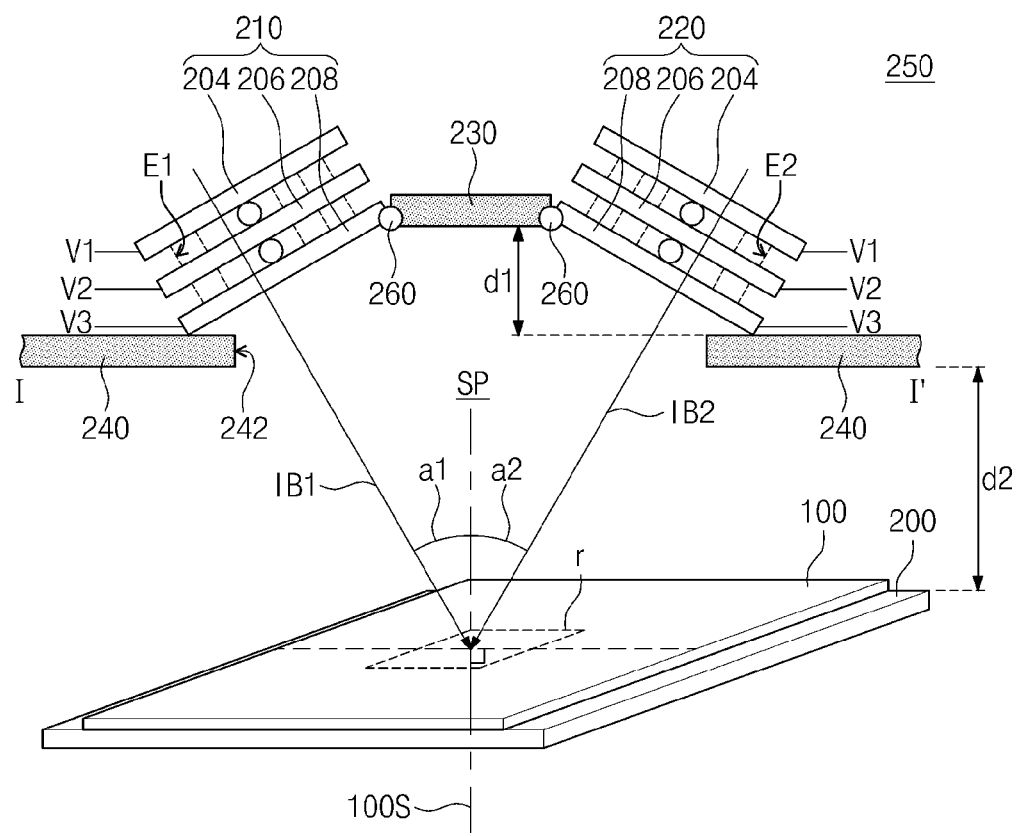
FIG. 15 is a schematic diagram of a portion of the ion beam apparatus of FIG. 13 illustrating use of the ion beam control part of FIG. 14 to radiate ion beams to a substrate.

FIG. 13 is a schematic diagram illustrating an ion beam apparatus 500 for generating ion beams IB1 and IB2 of bilateral symmetry according to some embodiments of the inventive concepts. FIG. 14 is a plan view illustrating an ion beam control part 250 of the ion beam apparatus 500 of FIG. 13. FIG. 15 is a schematic diagram of a portion of the ion beam apparatus 500 of FIG. 13, illustrating use of the ion beam control part 250 of FIG. 14 to radiate ion beams IB1 and IB2 to a substrate.

Referring to FIGS. 13 through 15, an ion beam apparatus 500 may include a source chamber 502 generating an ion beam IB and a process chamber 504. A process may be performed within the process chamber 504 using the ion beam IB. The source chamber 502 and the process chamber 504 may be connected to each other.

The source chamber 502 may include an ion source part 202 and an ion beam control part 250. The ion source part 202 may generate the ion beam IB from plasma formed therein. The ion beam control part 250 may be provided between the ion source part 202 and the process chamber 504 to control an optical path of the ion beam IB radiated into the process chamber 504. The process chamber 504 may include a stage 200 on which a substrate 100 corresponding to an etch target is loaded. According to an embodiment, the ion source part 202 may be provided over the stage 200, and the ion beam control part 250 may be provided between the ion source part 202 and the stage 200. The ion beam control part 250 may control an incidence angle a1 and/or a2 of the ion beam IB radiated to a surface of the substrate 100 loaded on the stage 200.

The ion beam control part 250 may include a first grid 210 and a second grid 220 horizontally spaced apart from each other. A connection part 230 may be provided between and connected to the first and second grids 210 and 220, respectively, and a support part 240 may support the first and second grids 210 and 220, respectively.

As illustrated in FIG. 14, the first grid 210, the second grid 220, and the connection part 230 may have substantially bar-like shapes extending in a first direction D1. A second direction D2 intersects the first direction D1. The ends of the connection part 230 are located opposite to each other in the second direction D2 and may each be connected to a corresponding end of the first grid 210 or the second grid 220. Clamps 260 may be provided between the connection part 230 and the first grid 210 and between the connection part 230 and the second grid 220. The first and second grids 210 and 220, respectively, may be connected and/or fixed to the connection part 230 by the clamps 260.

As illustrated in FIG. 14, the support part 240 may have an outer sidewall having a substantially circular shape when viewed in plan view. The support part 240 may include an opening 242 formed therein. The first grid 210, the second grid 220, and the connection part 230 may be disposed on the support part 240 to overlap with the opening 242 in a plan view. Another end of the first grid 210 and another end of the second grid 220 may be connected to the support part 240. Rollers 262 may be provided between the first grid 210 and the support part 240 and between the second grid 220 and the support part 240. The first and second grids 210 and 220, respectively, may be connected to the support part 240 by the rollers 262. The rollers 262 may permit each of the first and second grids 210 and 220, respectively, to slide in the second direction D2 and a direction anti-parallel to the second direction D2 along a top surface of the support part 240. The connection part 230 may be spaced apart from the support part 240.

The connection part 230 may be disposed at a level higher than that of the support part 240, measured from a top surface 200U of the stage 200. Each of the first and second grids 210 and 220, respectively, may be tilted with respect to the top surface 200U of the stage 200. In some embodiments, the first grid 210 may be tilted at a first angle θ1 with respect to a reference plane 200S that is parallel to the top surface 200U of the stage 200, and the second grid 220 may be tilted at a second angle θ2 with respect to the reference plane 200S. The first angle θ1 may be substantially equal to the second angle θ2. In other words, a magnitude of the first angle θ1 may be substantially equal to that of the second angle θ2. In this case, the first grid 210 and the second grid 220 may be arranged substantially symmetrically to each other with the connection part 230 interposed therebetween. The support part 240 may be disposed at a level that is lower than that of the first and second grids 210 and 220, respectively, measured from the top surface 200U of the stage 200.

Each of the first and second grids 210 and 220, respectively, may include a first sub-grid 208 and a second sub-grid 204 which are sequentially stacked. Each of the first and second sub-grids 208 and 204 may have a plurality of holes H. Each of the holes H of the first sub-grid 208 may be substantially aligned with a corresponding one of the holes H of the second sub-grid 204. Each of the first and second grids 210 and 220, respectively, may further include a third sub-grid 206 disposed between the first sub-grid 208 and the second sub-grid 204. The third sub-grid 206 may also have a plurality of holes H. Each of the holes H of the third sub-grid 206 may be substantially aligned with a corresponding one of the holes H of the first sub-grid 208 and a corresponding one of the holes H of the second sub-grid 204. Clamps 260 may be provided between the first sub-grid 208 and the third sub-grid 206 and between the third sub-grid 206 and the second sub-grid 204. The first to third sub-grids 208, 204, and 206, respectively, may be fixed to each other by the clamps 260.

Referring to FIGS. 13 and 15, the ion beam IB generated from the ion source part 202 may be divided into a first ion beam IB1 and a second ion beam IB2 using the ion beam control part 250. The first ion beam IB1 may be guided by the first grid 210 so as to be radiated to a surface of the substrate 100, and the second ion beam IB2 may be guided by the second grid 220 so as to be radiated to the surface of the substrate 100. The first ion beam IB1 may have a first incidence angle a1 with respect to a normal line 100S that is perpendicular to the top surface of the substrate 100, and the second ion beam IB2 may have a second incidence angle a2 with respect to the normal line 100S. The first incidence angle a1 may be substantially equal to the second incidence angle a2. The first ion beam IB1 and the second ion beam IB2 may therefore be symmetrically arranged with respect to the normal line 100S. The first ion beam IB1 and the second ion beam IB2 may be radiated to one region r of the surface of the substrate 100 at the same time. The one region r may be a region of a range corresponding to a distance between a plurality of patterns to be formed on the substrate by the first and second ion beams IB1 and IB2, respectively. For example, the one region r may be a region of a range corresponding to the distance A between the magnetic tunnel junction structures MTJS, as previously described with reference to FIG. 9. A desirable range for each of the first and second incidence angles a1 and a2, respectively, may be the same as described with reference to FIGS. 4 to 7.

The first ion beam IB1 may be guided by a first electric field E1 generated in the first grid 210, and the second ion beam IB2 may be guided by a second electric field E2 generated in the second grid 220. The first electric field E1 may be generated by applying different voltages to the first to third sub-grids 208, 204, and 206, respectively, constituting the first grid 210. For example, a positive voltage V1, a negative voltage V2, and a ground voltage V3 may be applied to the second sub-grid 204, the third sub-grid 206, and the first sub-grid 208 of the first grid 210, respectively, to generate the first electric field E1. Likewise, the second electric field E2 may be generated by applying different voltages to the first to third sub-grids 208, 204, and 206, respectively, constituting the second grid 220. For example, a positive voltage V1, a negative voltage V2, and a ground voltage V3 may be applied to the second sub-grid 204, the third sub-grid 206, and the first sub-grid 208 of the second grid 220, respectively, to generate the second electric field E2.

An electric field may not be generated in a space SP between the ion beam control part 250 and the substrate 100. Thus, ions of the first ion beams IB1 may be accelerated by the first electric field E1 to move in a straight line to the surface of the substrate 100 in the space SP. Likewise, ions of the second ion beams IB2 may be accelerated by the second electric field E2 to move in a straight line to the surface of the substrate 100 in the space SP. As a result, the first ion beam IB1 and the second ion beam IB2 may be radiated to the surface of the substrate 100 while maintaining the symmetrical arrangement between the first and second ion beams IB1 and IB2, respectively.

The connection part 230 may be vertically spaced apart from the support part 240 by a first distance d1. The first distance d1 may be the shortest distance between a bottom surface of the connection part 230 and a top surface of the support part 240. The support part 240 may be vertically spaced apart from the stage 200 by a second distance d2. The second distance d2 may be the shortest distance between a bottom surface of the support part 240 and the top surface of the stage 200. As illustrated in FIG. 13, the first grid 210 may be tilted at the first angle $\theta1$ with respect to the top surface 200U of the stage 200, and the second grid 220 may be tilted at the second angle $\theta2$ with respect to the top surface 200U of the stage 200. Thus, the first ion beam IB1 may be radiated to the surface of the substrate 100 at the first incidence angle a1, and the second ion beam IB2 may be radiated to the surface of the substrate at the second incidence angle a2.

According to some embodiments, the tilt angles or slopes (i.e., the first and second angles $\theta1$ and $\theta2$) of the first and second grids 210 and 220, respectively, may be changed to control the first and second incidence angles a1 and a2, respectively, of the first and second ion beams IB1 and IB2, respectively. More particularly, the first and second angles $\theta1$ and $\theta2$, respectively, may be adjusted by changing the first distance d1 between the connection part 230 and the support part 240. If the first distance d1 is changed, the second distance d2 between the stage 200 and the support part 240 may also be changed to radiate the first and second ion beams IB1 and IB2, respectively, to the one region r of the surface of the substrate 100.

Figure 16A:
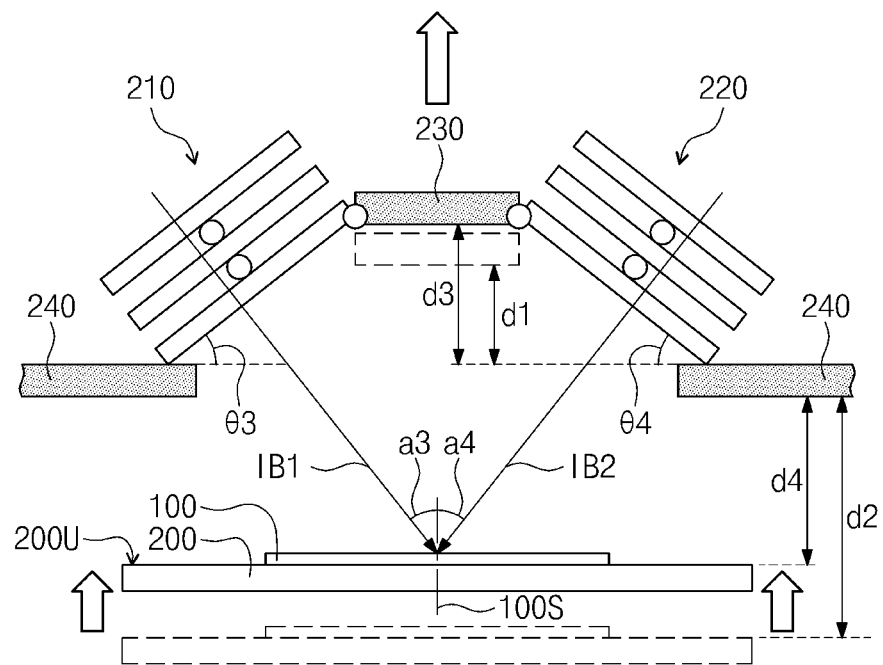
FIGS. 16A and 16B are schematic diagrams of a portion of the ion beam apparatus of FIG. 13 illustrating how incidence angles of the ion beams may be controlled using the ion beam control part of FIG. 15.
Figure 16B:
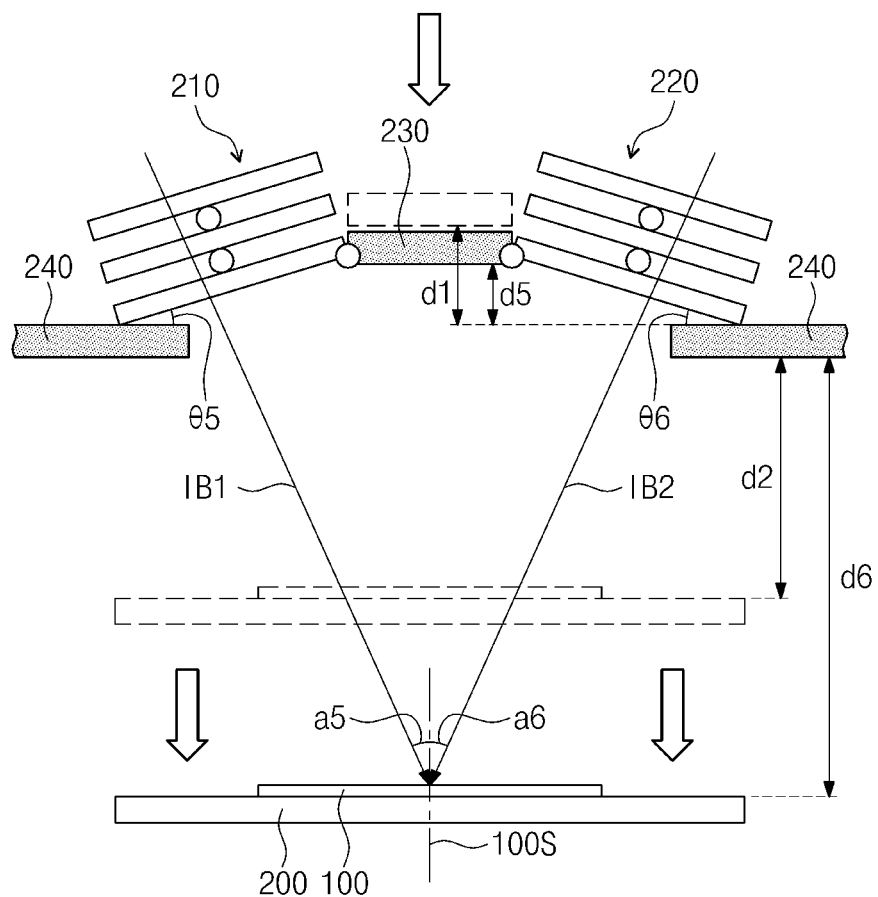

FIGS. 16A and 16B are schematic diagrams of a portion of the ion beam apparatus 500 of FIG. 13 illustrating how incidence angles of the ion beams IB1 and IB2 may be controlled using the ion beam control part 250 of FIG. 15.

Referring to FIG. 16A, the connection part 230 may move in a direction perpendicular to the top surface of the substrate 100 to increase or decrease the distance between it and the support part 240. As shown in FIG. 16A, the connection part 230 is moved vertically away from the support part 240 to a third distance d3. The third distance d3 may be the shortest distance (i.e., a vertical distance) between the bottom surface of the connection part 230 and the top surface of the support part 240. The third distance d3 may be greater than the first distance d1. Thus, the first grid 210 may be tilted at a third angle $\theta3$ with respect to the top surface 200U of the stage 200. The third angle $\theta3$ may be greater than the first angle $\theta1$. Likewise, the second grid 220 may be tilted at a fourth angle $\theta4$ with respect to the top surface 200U of the stage 200. The fourth angle $\theta4$ may be greater than the second angle $\theta2$. The third angle $\theta3$ may be substantially equal to the fourth angle $\theta4$. In other words, symmetry between the first grid 210 and the second grid 220 may be maintained.

Since the first grid 210 and the second grid 220 are tilted at the third angle $\theta3$ and the fourth angle $\theta4$ with respect to the top surface 200U of the stage 200, respectively, the first ion beam IB1 guided through the first grid 210 may be radiated to the surface of the substrate 100 at a third incidence angle a3, and the second ion beam IB2 guided through the second grid 220 may be radiated to the surface of the substrate 100 at a fourth incidence angle a4. The third incidence angle a3 may be greater than the first incidence angle a1, and the fourth incidence angle a4 may be greater than the second incidence angle a2. The third incidence angle a3 may be substantially equal to the fourth incidence angle a4. Symmetry between the first and second ion beams IB1 and IB2, respectively, may thereby be maintained. Furthermore, the stage 200 may also be moved in the direction perpendicular to the top surface of the substrate 100. In this case, it is moved nearer to the support part 240, decreasing the distance between the stage 200 and the support part 240. After movement of the stage 200, the stage 200 may be spaced apart from the support part 240 by a fourth distance d4. The fourth distance d4 may correspond to the shortest distance (i.e., a vertical distance) between the bottom surface of the support part 240 and the top surface 200U of the stage 200. The fourth distance d4 may be smaller than the second distance d2. Thus, the first ion beam IB1 and the second ion beam IB2 may be radiated to the one region r of the surface of the substrate 100.

Referring to FIG. 16B, the connection part 230 may alternatively move downward in a direction perpendicular to the top surface of the substrate 100 to be nearer the support part 240. In other words, the connection part 230 may be moved vertically to be spaced apart from the support part 240 by a fifth distance d5. The fifth distance d5 may correspond to the vertical distance between the bottom surface of the connection part 230 and the top surface of the support part 240. The fifth distance d5 may be smaller than the first distance d1. Thus, the first grid 210 may be tilted at a fifth angle $\theta5$ with respect to the top surface 200U of the stage 200. The fifth angle $\theta5$ may be smaller than the first angle $\theta1$. Likewise, the second grid 220 may be tilted at a sixth angle $\theta6$ with respect to the top surface 200U of the stage 200. The sixth angle $\theta6$ may be smaller than the second angle $\theta2$. The fifth angle $\theta5$ may be substantially equal to the sixth angle $\theta6$ and symmetry between the first grid 210 and the second grid 220 may be maintained.

Since the first grid 210 and the second grid 220 are tilted at the fifth angle $\theta5$ and the sixth angle $\theta6$ with respect to the top surface 200U of the stage 200, respectively, the first ion beam IB1 guided through the first grid 210 may be radiated to the surface of the substrate 100 at a fifth incidence angle a5 and the second ion beam IB2 guided through the second grid 220 may be radiated to the surface of the substrate 100 at a sixth incidence angle a6. The fifth incidence angle a5 may be smaller than the first incidence angle a1, and the sixth incidence angle a6 may be smaller than the second incidence angle a2. The fifth incidence angle a5 may be substantially equal to the sixth incidence angle a6 and symmetry between the first and second ion beams IB1 and IB2, respectively, may be maintained. In this case, the stage 200 may move downward in the direction perpendicular to the top surface of the substrate 100 to become increase its distance from the support pattern 240. After downward movement of the stage 200, the stage 200 may be spaced apart from the support part 240 by a sixth distance d6. The sixth distance d6 may correspond to a vertical distance between the bottom surface of the support part 240 and the top surface 200U of the stage 200. The sixth distance d6 may be greater than the second distance d2. Thus, the first ion beam IB1 and the second ion beam IB2 may be radiated to the one region r of the surface of the substrate 100.

Figure 17:
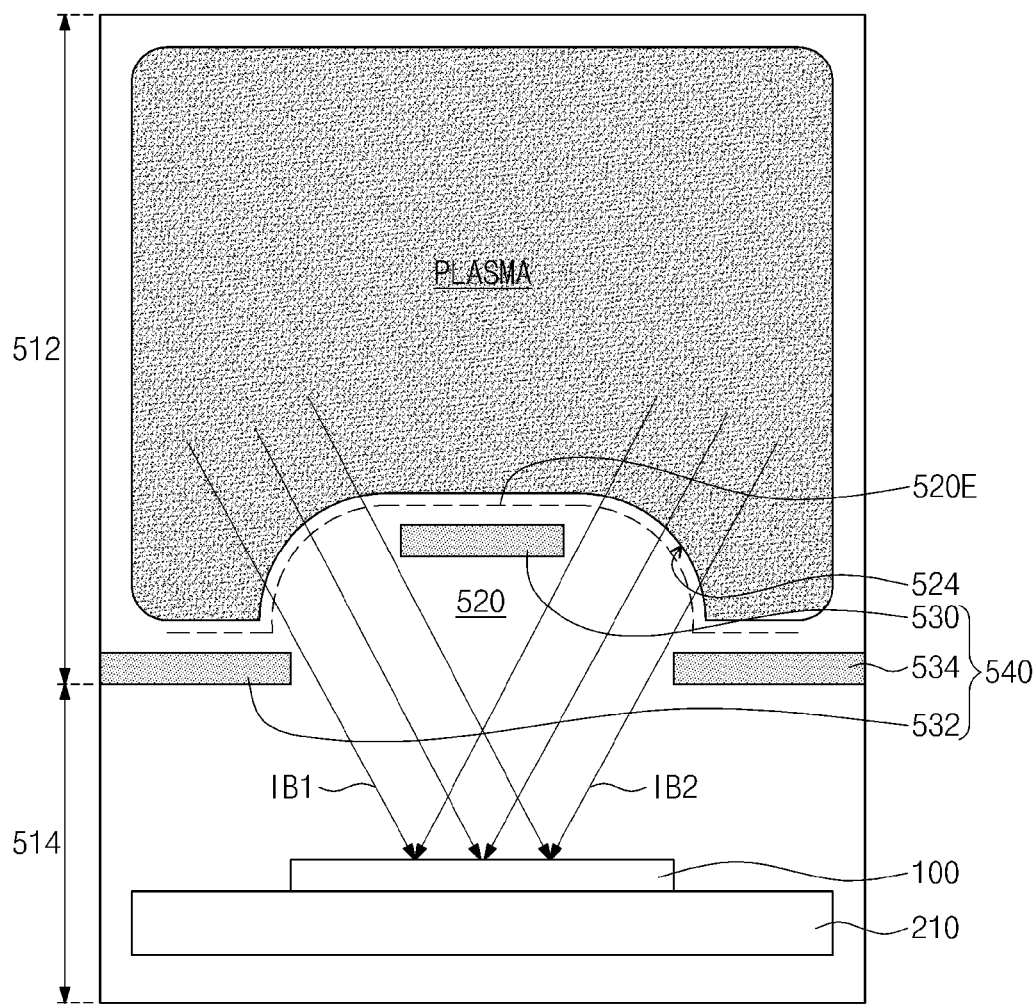
FIG. 17 is a schematic diagram illustrating an ion beam apparatus for generating ion beams of bilateral symmetry according to other embodiments of the inventive concepts.

FIG. 17 is a schematic diagram illustrating an ion beam apparatus 510 for generating ion beams IB1 and IB2 of bilateral symmetry according to other embodiments of the inventive concepts.

Referring to FIG. 17, an ion beam apparatus 510 may include a source chamber 512 generating ion beams IB1 and IB2, and a process chamber 514. A process using the ion beams IB1 and IB2 may be performed in the process chamber 514. The source chamber 512 and the process chamber 514 may be connected to each other.

Plasma used as a source of the ion beams IB1 and IB2 may be provided in the source chamber 512. The process chamber 514 may include a stage 200 on which an etch target substrate 100 is loaded. A voltage may be applied to the substrate 100, so that ions from the plasma may be radiated to the substrate 100 to in the form of ion beams IB1 and IB2. A sheath region 520 having electrons may be defined between the plasma and the substrate 100. The number of electrons in the sheath region 520 may be less than the number of electrons in the plasma. The sheath region 520 may referred to as a "plasma sheath."

Insulators 540 may be provided in the source chamber 512. The insulators 540 may, for example, be formed of at least one of quartz, glass, or silicon nitride. The insulators 540 may include a first insulator 532 and a second insulator 534 that are spaced horizontally apart from each other but are disposed at substantially the same level from the substrate 100. The insulators 540 may further include a third insulator 530 that is disposed horizontally between the first and second insulators 532 and 534 and at a higher level than the first and second insulators 532 and 534 from the substrate 100. Although not shown, each of the first to third insulators 532, 534, and 530 may have a substantially bar-like shape when viewed in plan view. However, the inventive concepts are not limited thereto. The first to third insulators 532, 534, and 530 may have any of various shapes.

The insulators 540 may change a form of an electric field 520E in the plasma sheath 520 to control a shape of a boundary line 524 between the plasma and the plasma sheath 520. In some embodiments, the plasma may be provided over the substrate 100, and the insulators 540 may be provided between the plasma and the substrate 100. The insulators 540 may control the shape of the boundary line 524 between the plasma and the plasma sheath 520, so that incidence angles of the ion beams IB1 and IB2 radiated to the surface of the substrate 100 may be controlled.

More particularly, the ions provided from the plasma may intersect the boundary line 524 between the first and third insulators 532 and 530, respectively, so as to be radiated to the substrate 100 through a gap region between the first and third insulators 532 and 530, respectively, or may intersect the boundary line 524 between the second and third insulators 534 and 530, respectively, so as to be radiated to the substrate 100 through a gap region between the second and third insulators 534 and 530, respectively. The ions intersecting the boundary line 524 between the first and third insulators 532 and 530, respectively, so as to be radiated to the substrate 100 through the gap region between the first and third insulators 532 and 530, respectively, may constitute a first ion beam IB1. The ions intersecting the boundary line 524 between the second and third insulators 534 and 530, respectively, so as to be radiated to the substrate 100 through the gap region between the second and third insulators 534 and 530, respectively, may constitute a second ion beam IB2.

The first ion beam IB1 and the second ion beam IB2 may have a first incidence angle a1 and a second incidence angle a2, respectively, measured with respect to a normal line 100S that is perpendicular to a top surface of the substrate 100, as described previously with reference to FIG. 15. The first incidence angle a1 may be substantially equal to the second incidence angle a2, so the first ion beam IB1 and the second ion beam IB2 may be symmetrically arranged with respect to the normal line 100S. The first ion beam IB1 and the second ion beam IB2 may be radiated to one region of the surface of the substrate 100 at substantially the same time. The one region may be a region of a range corresponding to a distance between patterns to be formed on the substrate 100. For example, the one region may be a region of a range corresponding to the distance A between magnetic tunnel junction structures MTJS as described with reference to FIG. 9. A range of each of the first and second incidence angles may be the same as described with reference to FIGS. 4 to 7.

According to embodiments of the inventive concepts, when an etch target layer is patterned using first and second ion beams of bilateral symmetry, a first sidewall of one pattern in a pair of adjacent patterns and a second, opposing sidewall of the other pattern in the pair may be formed. Thus, if etch-byproducts removed from the first sidewall by the first ion beam are re-deposited on the second sidewall, those re-deposited etch-byproducts may be removed using the second ion beam. Likewise, etch-byproducts that are removed from the second sidewall by the second ion beam and are re-deposited on the first sidewall may be removed by the first ion beam. As a result, it is possible to easily control the sidewall profiles of the patterns.

In addition, when magnetic tunnel junction patterns of a magnetic memory device are patterned using first and second ion beams of bilateral symmetry, the first sidewall of a magnetic tunnel junction pattern in an adjacent pair and a second, opposing sidewall of the other magnetic tunnel junction pattern in the pair may be substantially simultaneously formed. Thus, if the etch-byproducts from the first sidewall by the first ion beam are re-deposited on the second sidewall, the re-deposited etch-byproducts may be removed using the second ion beam. Likewise, etch-byproducts removed from the second sidewall using the second ion beam that are re-deposited on the first sidewall can be removed by the first ion beam. In this manner, it is possible to minimize cell defects of a magnetic memory device that may otherwise be caused by the etch-byproducts. As a result, a magnetic memory device having excellent reliability may be manufactured.

Furthermore, some embodiments of the inventive concepts may provide an ion beam apparatus capable of substantially simultaneously providing first and second ion beams having bilateral symmetry. An ion beam apparatus may include a first grid and a second grid that are horizontally spaced apart from each other and are each tilted at a desired angle with respect to the top surface of the stage. A first ion beam may be guided by a first electric field generated in the first grid, and a second ion beam may be guided by a second electric field generated in the second grid. First and second ion beams may be radiated to the surface of a substrate while maintaining symmetry between the first and second ion beams. In addition, slopes of the first and second grids with respect to the top surface of the stage may be changed to adjust the incidence angles of the first and second ion beams radiated to the surface of the substrate. As a result, the ion beam apparatus may be capable of stably providing first and second ion beams of bilateral symmetry onto the substrate, and may further be capable of controlling or adjusting the incidence angles of the first and second ion beams.

Figure 18:
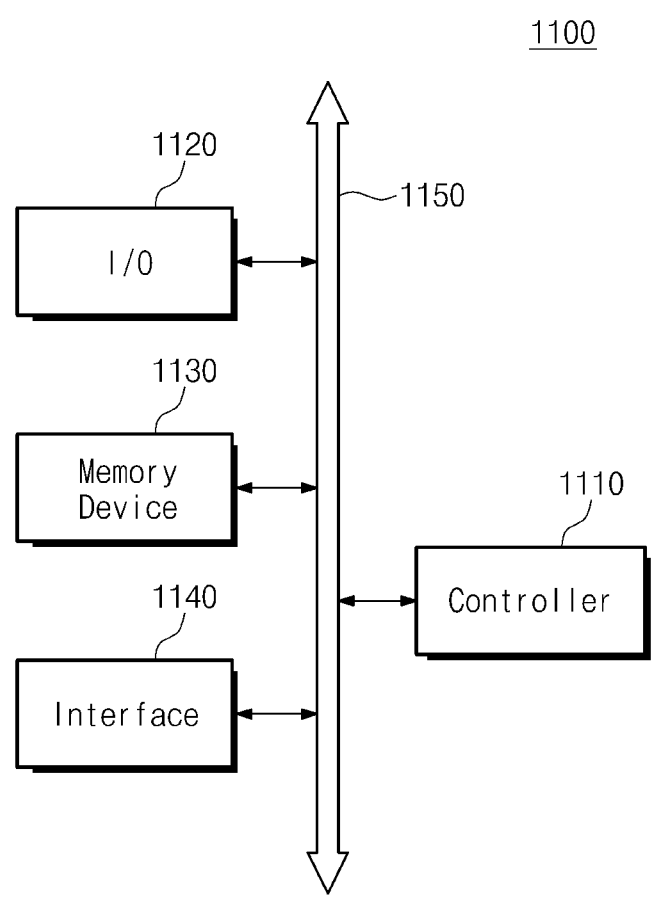
FIG. 18 is a schematic block diagram illustrating an example of an electronic system including a semiconductor device produced and constructed according to embodiments of the inventive concepts.

FIG. 18 is a schematic block diagram illustrating an example of an electronic system 1100 including a semiconductor memory device produced and constructed according to embodiments of the inventive concepts.

Referring to FIG. 18, an electronic system 1100 according to an embodiment of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which data is transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. If the semiconductor devices according to the aforementioned embodiments are realized as semiconductor memory devices, the memory device 1130 may include at least one such device constructed according to the embodiments described above. The interface unit 1140 may transmit electrical data to a communication network or may receive electrical data from a communication network. The interface unit 1140 may operate wirelessly or through a cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products. The other electronic products may receive or transmit information data wirelessly.

Figure 19:
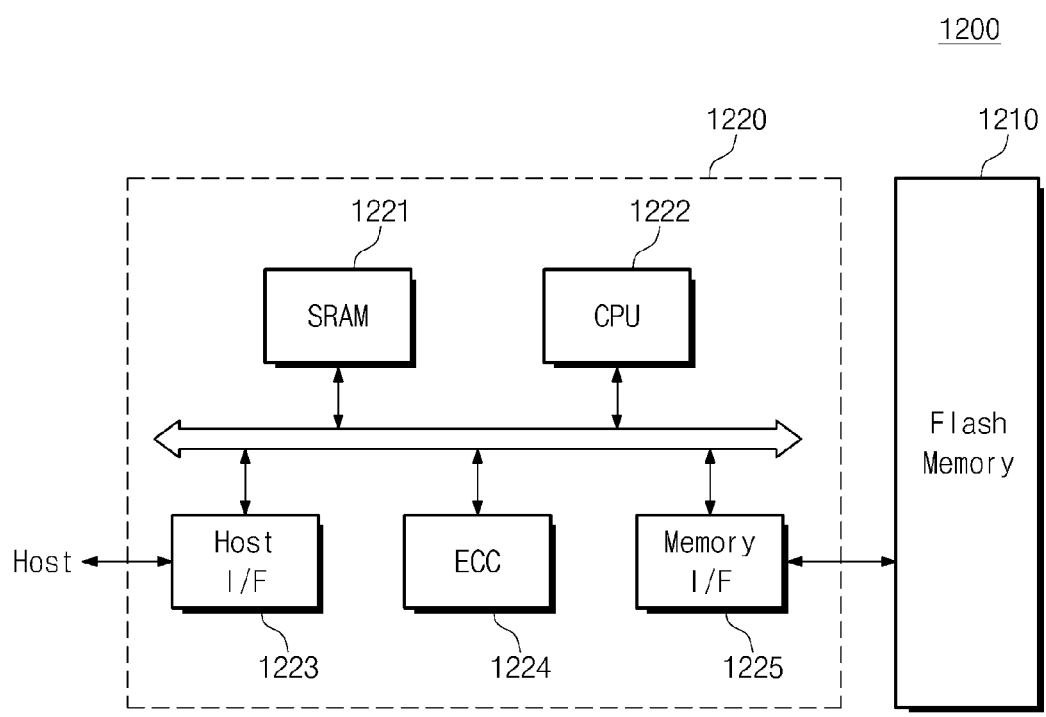
FIG. 19 is a schematic block diagram illustrating an example of a memory card including a semiconductor device produced and constructed according to embodiments of the inventive concepts.

FIG. 19 is a schematic block diagram illustrating a memory card 1200 including a semiconductor device constructed according to embodiments of the inventive concepts.

Referring to FIG. 19, a memory card 1200 according to an embodiment of the inventive concepts may include a memory device 1210. If the semiconductor devices of the embodiments described above are realized as semiconductor memory devices, the memory device 1210 may include at least one such device. The memory card 1200 may further include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Although not shown, the memory card 1200 may further include a read only memory (ROM) device that stores code data to interface with the host. The memory card 1200 may be used as a portable data storage card. Alternatively, the memory card 1200 may be realized in solid state disks (SSD) which are used as hard disks of computer systems.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined through the broadest permissible interpretation of the following claims and their equivalents, and should not be otherwise restricted or limited by the foregoing description.

What is claimed is:
1. An ion beam apparatus comprising:
a stage on which a substrate can be loaded;
an ion source part provided over the stage and capable of generating an ion beam; and
an ion beam control part provided between the stage and the ion source part, the ion beam control part capable of controlling an optical path of the ion beam radiated to a surface of the substrate,
wherein the ion beam control part comprises:
a first grid and a second grid horizontally spaced apart from each other,
wherein, during operation, the ion beam is divided into a first ion beam and a second ion beam by the first and second grids,
wherein, during operation, the first ion beam is guided by the first grid to be radiated to the surface of the substrate at a first incidence angle,
wherein, during operation, the second ion beam is guided by the second grid to be radiated to the surface of the substrate at a second incidence angle,
wherein, during operation, the first ion beam and the second ion beam are substantially symmetrically provided with respect to each other about a normal line that is perpendicular to the surface of the substrate, and wherein the first incidence angle and the second incidence angle are adjustable by adjusting a tilt angle of the first grid and a tilt angle of the second grid.

2. The ion beam apparatus of claim 1,
wherein the first ion beam and the second ion beam are guided to be radiated to one region of the surface of the substrate, and
wherein the one region of the surface of the substrate is a region of a range corresponding to a distance between patterns which are to be formed using the first ion beam and the second ion beam.

3. The ion beam apparatus of claim 2,
wherein the first ion beam and the second ion beam are radiated to the one region of the surface of the substrate at substantially the same time.

4. The ion beam apparatus of claim 2,
wherein the first incidence angle is approximately equal to the second incidence angle.

5. The ion beam apparatus of claim 1,
wherein each of the first grid and the second grid comprises:
a first sub-grid and a second sub-grid sequentially stacked, each of the first sub-grid and the second sub-grid having a plurality of holes,
wherein each of the plurality of holes of the first sub-grid is substantially aligned with a corresponding one of the plurality of holes of the second sub-grid.

6. The ion beam apparatus of claim 5,
wherein each of the first grid and the second grid guides each of the first ion beam and the second ion beam using an electric field that is generated by supplying the first sub-grid and the second sub-grid with different voltages from each other.

7. The ion beam apparatus of claim 6,
wherein an electric field is not generated in a space between the substrate and the ion beam control part.

8. The ion beam apparatus of claim 5,
wherein each of the first grid and the second grid further comprises:
a third sub-grid having a plurality of holes, the third sub-grid disposed between the first sub-grid and the second sub-grid,
wherein each of the plurality of holes of the third sub-grid is substantially aligned with a corresponding one of the plurality of holes of the first sub-grid and a corresponding one of the plurality of holes of the second sub-grid.

9. The ion beam apparatus of claim 8,
wherein the first grid and the second grid guide a corresponding one of the first ion beam and the second ion beam using an electric field that is generated by supplying the first sub-grid, the second sub-grid, and the third sub-grid with different voltages from each other.

10. The ion beam apparatus of claim 1,
wherein the ion beam control part further comprises:
a connection part provided between the first grid and the second grid,
wherein each of the connection part, the first grid, and the second grid has a substantially bar-like shape extending in a first direction when viewed in plan view, and
wherein a first end of the connection part face a second end of the connection part in a second direction that intersects the first direction,
wherein the first end of the connection part is connected to one end of the first grid, and wherein the second end of the connection part is connected to one end of the second grid.

11. The ion beam apparatus of claim 10,
wherein the ion beam control part further comprises:
a support part supporting the first grid and the second grid, and
wherein another end of the first grid and another end of the second grid are connected to the support part.

12. The ion beam apparatus of claim 11,
wherein the connection part is disposed at a level that is higher than that of the support part from a top surface of the stage, and
wherein each of the first grid and the second grid is tilted with respect to the top surface of the stage.

13. The ion beam apparatus of claim 12, wherein the first grid and the second grid are arranged symmetrical to each other with the connection part interposed therebetween.

14. The ion beam apparatus of claim 13,
wherein the support part is disposed at a level lower than that of the first grid and that of the second grid from the top surface of the stage.

15. The ion beam apparatus of claim 12,
wherein the first incidence angle and the second incidence angle are adjustable by tilting the first grid and the second grid at different angles with respect to the top surface of the stage.

16. The ion beam apparatus of claim 15,
wherein angles at which the first grid and the second grid are tilted with respect to the top surface of the stage are adjustable by changing a first vertical distance between the connection part and the support part.

17. The ion beam apparatus of claim 16,
wherein a second vertical distance between the top surface of the stage and the support part is adjustable to guide the first ion beam and the second ion beam to one region on the substrate when the first vertical distance between the connection part and the support part is changed, and
wherein the one region is a region of a range corresponding to a distance between adjacent patterns on the substrate which are to be formed using the first ion beam and the second ion beam.

18. An ion beam apparatus, comprising:
a plasma chamber and a process chamber; and
an ion beam control part arranged between the plasma chamber and the process chamber, wherein the ion beam control part comprises:
a first grid configured to supply a first ion beam to a substrate to be arranged in the process chamber at a first incidence angle; and
a second grid configured to supply a second ion beam to the substrate to be arranged in the process chamber at a second incidence angle,
wherein the first incidence angle and the second incidence angle are substantially the same in magnitude, and
wherein the first ion beam and the second ion beam are substantially symmetrical to each other about a normal line that is perpendicular to the substrate, and
wherein the first incidence angle and the second incidence angle are adjustable by adjusting a tilt angle of the first grid and a tilt angle of the second grid.

19. The ion beam apparatus of claim 18,
wherein a distance between the ion beam control part and the substrate is adjustable.

* * * * *